(12) United States Patent
Trachewsky et al.

(10) Patent No.: US 8,479,076 B2
(45) Date of Patent: Jul. 2, 2013

(54) HEADER ENCODING FOR SINGLE CARRIER (SC) AND/OR ORTHOGONAL FREQUENCY DIVISION MULTIPLEXING (OFDM) USING SHORTENING, PUNCTURING, AND/OR REPETITION

(75) Inventors: Jason A. Trachewsky, Menlo Park, CA (US); Ba-Zhong Shen, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 13/592,238

(22) Filed: Aug. 22, 2012

(65) Prior Publication Data

US 2012/0314711 A1 Dec. 13, 2012

Related U.S. Application Data

(63) Continuation of application No. 12/612,648, filed on Nov. 4, 2009, now Pat. No. 8,255,760.

(60) Provisional application No. 61/111,685, filed on Nov. 5, 2008, provisional application No. 61/156,857, filed on Mar. 2, 2009, provisional application No. 61/235,732, filed on Aug. 21, 2009.

(51) Int. Cl.
*G06F 11/00* (2006.01)
(52) U.S. Cl.
USPC ............................ 714/752; 714/784; 714/790
(58) Field of Classification Search
USPC .......................................... 714/752, 784, 790
See application file for complete search history.

(56) References Cited

U.S. PATENT DOCUMENTS

| | | | |
|---|---|---|---|
| 2007/0086539 A1* | 4/2007 | Hocevar | 375/267 |
| 2008/0168332 A1* | 7/2008 | Palanki et al. | 714/776 |
| 2008/0204286 A1* | 8/2008 | Kose | 341/67 |
| 2009/0254795 A1* | 10/2009 | Palanki et al. | 714/776 |
| 2010/0077276 A1* | 3/2010 | Okamura et al. | 714/752 |
| 2010/0232544 A1* | 9/2010 | Myung et al. | 375/295 |
| 2011/0107175 A1* | 5/2011 | Shen et al. | 714/752 |
| 2011/0286535 A1* | 11/2011 | Ko et al. | 375/259 |
| 2011/0305300 A1* | 12/2011 | Ko | 375/298 |

* cited by examiner

*Primary Examiner* — Marc Duncan
(74) *Attorney, Agent, or Firm* — Garlick & Markison; Shayne X. Short

(57) ABSTRACT

Header encoding for SC and/or OFDM signaling using shortening, puncturing, and/or repetition in accordance with encoding header information within a frame to be transmitted via a communication channel employs different respective puncturing patterns as applied to different portions thereof. For example, a first puncturing pattern is applied to a first portion of the frame, and a second puncturing pattern is applied to a second portion of the frame (the second portion may be a repeated version of the first portion). Shortening (e.g., by padding 0-valued bits thereto) may be made to header information bits before they undergo encoding (e.g., in an LDPC encoder). One or both of the information bits and parity/redundancy bits output from the encoder undergo selective puncturing. Moreover, one or both of the information bits and parity/redundancy bits output from the encoder may be repeated/spread before undergoing selective puncturing to generate a header.

20 Claims, 28 Drawing Sheets

Fig. 7 (SC header encoding)(eff. rate 1/8)

Fig. 8 (OFDM header encoding)(eff. rate 1/12)

Fig. 9 (SC header encoding)(eff. rate K/N)

Fig. 10 (SC ex 1: no puncturing)(eff. rate 1/8)

Fig. 11 (SC ex 2: same puncturing pattern)(eff. rate 1/7)

Fig. 12 (SC ex 3: different puncturing pattern)(eff. rate 1/7)

Fig. 13 (SC ex 4: different puncturing pattern)(eff. rate 1/7)

Fig. 14 (SC ex 5: different puncturing pattern)(eff. rate 9/56)

Fig. 16 Exp. decaying PDP Rayleigh channel with QPSK SC PHY header

Fig. 17 (OFDM header encoding)(eff. rate K/N)

Fig. 18 (OFDM ex 1: no puncturing)(eff. rate 1/12)

Fig. 19 (OFDM ex 2: same puncturing pattern)(eff. rate 2/21)

Fig. 20 (OFDM ex 3: different puncturing pattern)(eff. rate 2/21)

Fig. 21 (OFDM ex 4: different puncturing pattern)(eff. rate 2/21)

Fig. 22 (OFDM ex 5: different puncturing pattern)(eff. rate 3/28)

Fig. 23  AWGN channel with QPSK OFDM PHY header

Fig. 24  Exp. decaying PDP Rayleigh channel with QPSK OFDM PHY header

Fig. 25 (SC ex 6: different puncturing pattern – incl. info. bits)(eff. rate K/N)

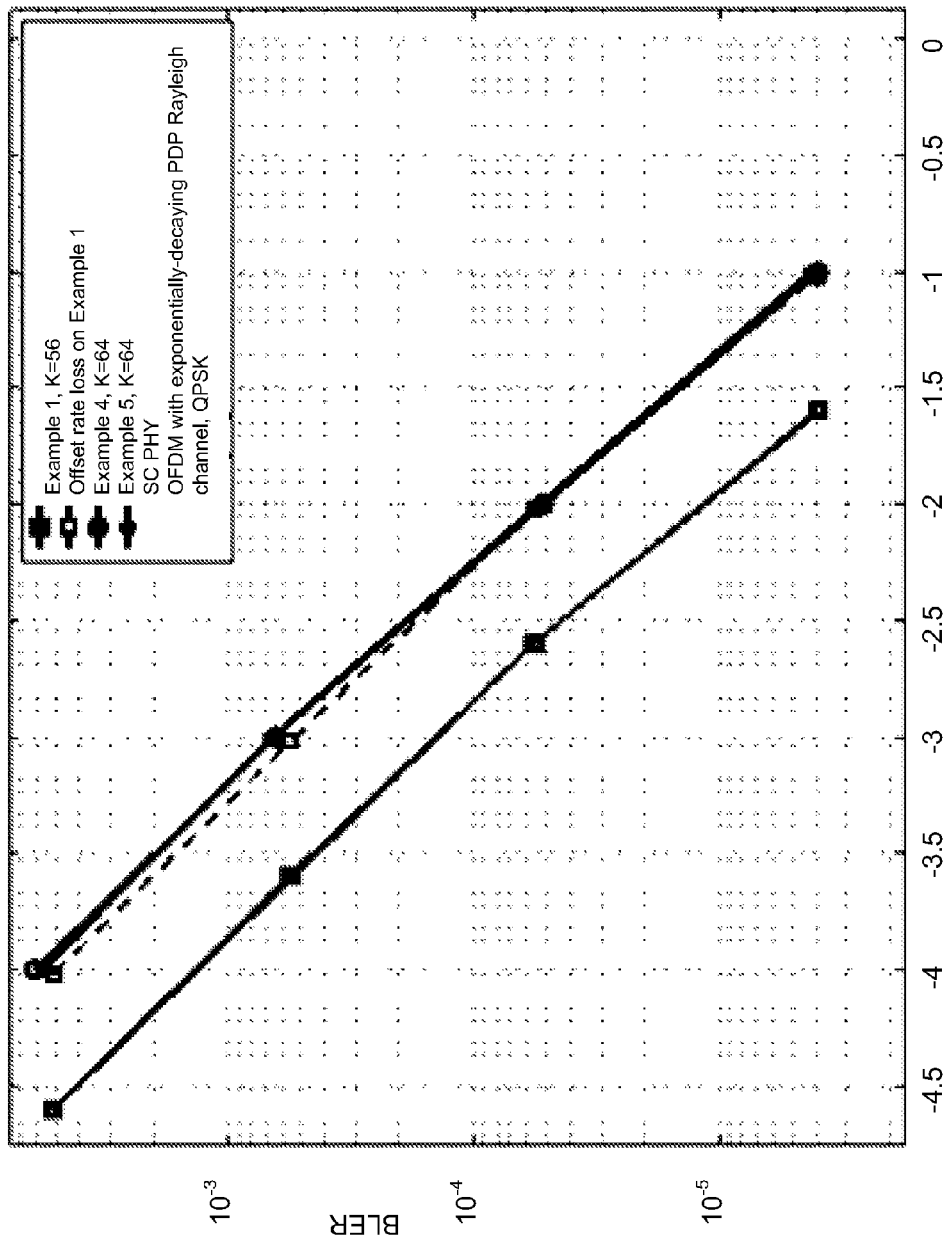

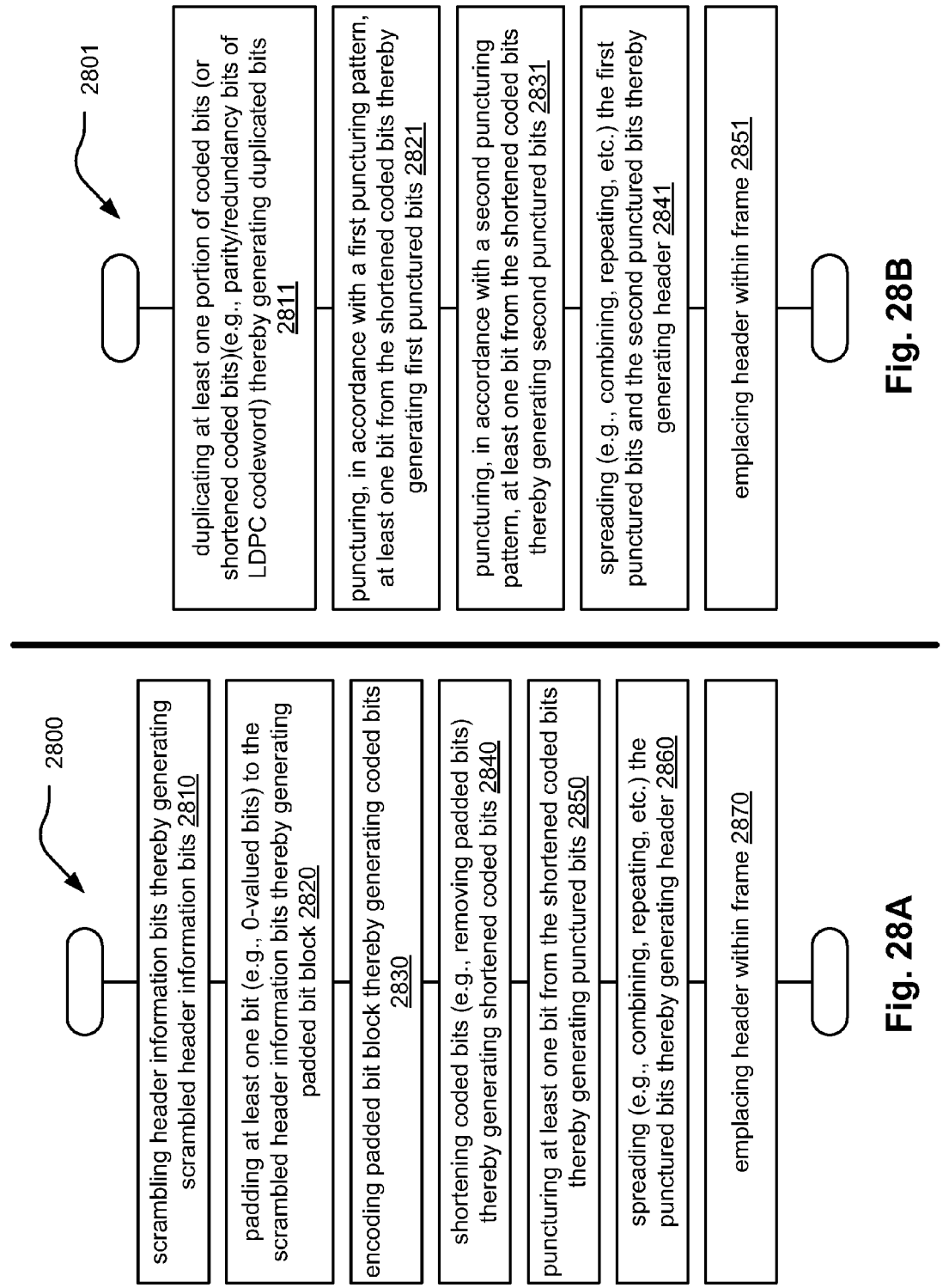

HEADER ENCODING FOR SINGLE CARRIER (SC) AND/OR ORTHOGONAL FREQUENCY DIVISION MULTIPLEXING (OFDM) USING SHORTENING, PUNCTURING, AND/OR REPETITION

CROSS REFERENCE TO RELATED PATENTS/PATENT APPLICATIONS

Continuation Priority Claim, 35 U.S.C. §120

The present U.S. Utility Patent Application claims priority pursuant to 35 U.S.C. §120, as a continuation, to the following U.S. Utility Patent Application which is hereby incorporated herein by reference in its entirety and made part of the present U.S. Utility Patent Application for all purposes:

1. U.S. Utility patent application Ser. No. 12/612,648, entitled "Header encoding for single carrier (SC) and/or orthogonal frequency division multiplexing (OFDM) using shortening, puncturing, and/or repetition," filed Nov. 4, 2009, and scheduled subsequently to be issued as U.S. Pat. No. 8,255,760 on Aug. 28, 2012 (as indicated in an ISSUE NOTIFICATION mailed from the USPTO on Aug. 8, 2012), which claims priority pursuant to 35 U.S.C. §119(e) to the following U.S. Provisional Patent Applications which are hereby incorporated herein by reference in their entirety and made part of the present U.S. Utility Patent Application for all purposes:
   1.1. U.S. Provisional Patent Application Ser. No. 61/111,685, entitled "60 GHz single carrier modulation," filed Nov. 5, 2008.
   1.2. U.S. Provisional Application Ser. No. 61/156,857, entitled "Header encoding/decoding," filed Mar. 2, 2009.
   1.3. U.S. Provisional Application Ser. No. 61/235,732, entitled "Header encoding for single carrier (SC) and/or orthogonal frequency division multiplexing (OFDM) using shortening, puncturing, and/or repetition," filed Aug. 21, 2009.

Incorporation by Reference

The following U.S. Utility Patent Applications are hereby incorporated herein by reference in their entirety and made part of the present U.S. Utility Patent Application for all purposes:

1. U.S. Utility application Ser. No. 12/605,088, entitled "Baseband unit having bit repetitive encoded/decoding," filed Oct. 23, 2009, pending, which claims priority pursuant to 35 U.S.C. §119(e) to the following U.S. Provisional Patent Application which is hereby incorporated herein by reference in its entirety and made part of the present U.S. Utility Patent Application for all purposes:
   1.1. U.S. Provisional Application Ser. No. 61/111,685, entitled "60 GHz single carrier modulation," filed Nov. 5, 2008, now expired.
2. U.S. Utility application Ser. No. 12/612,640, entitled "Header encoding/decoding," filed Nov. 4, 2009, now issued as U.S. Pat. No. 8,209,590 on Jun. 26, 2012, which claims priority pursuant to 35 U.S.C. §119(e) to the following U.S. Provisional Patent Applications which are hereby incorporated herein by reference in their entirety and made part of the present U.S. Utility Patent Application for all purposes:
   2.1. U.S. Provisional Application Ser. No. 61/111,685, entitled "60 GHz single carrier modulation," filed Nov. 5, 2008, now expired.
   2.2. U.S. Provisional Application Ser. No. 61/156,857, entitled "Header encoding/decoding," filed Mar. 2, 2009, now expired.
   2.3. U.S. Provisional Application Ser. No. 61/235,732, entitled "Header encoding for single carrier (SC) and/or orthogonal frequency division multiplexing (OFDM) using shortening, puncturing, and/or repetition," filed Aug. 21, 2009, now expired.

BACKGROUND OF THE INVENTION

1. Technical Field of the Invention

The invention relates generally to encoding of a field within a frame to be transmitted within a communication systems; and, more particularly, it relates to encoding of header information within a communication device that is operative in accordance with one or both of single carrier (SC) or orthogonal frequency division multiplexing (OFDM) signaling within such communication systems.

2. Description of Related Art

Data communication systems have been under continual development for many years. One such type of communication system that has been of significant interest lately is a communication system that employs iterative error correction codes (ECCs). Of particular interest is a communication system that employs LDPC (Low Density Parity Check) code. Communications systems with iterative codes are often able to achieve lower bit error rates (BER) than alternative codes for a given signal to noise ratio (SNR).

A continual and primary directive in this area of development has been to try continually to lower the SNR required to achieve a given BER within a communication system. The ideal goal has been to try to reach Shannon's limit in a communication channel. Shannon's limit may be viewed as being the data rate to be used in a communication channel, having a particular SNR, that achieves error free transmission through the communication channel. In other words, the Shannon limit is the theoretical bound for channel capacity for a given modulation and code rate.

LDPC code has been shown to provide for excellent decoding performance that can approach the Shannon limit in some cases. For example, some LDPC decoders have been shown to come within 0.3 dB (decibels) from the theoretical Shannon limit. While this example was achieved using an irregular LDPC code with a length of one million, it nevertheless demonstrates the very promising application of LDPC codes within communication systems.

The use of LDPC coded signals continues to be explored within many newer application areas. Some examples of possible communication systems that may employ LDPC coded signals include communication systems employing 4 wire twisted pair cables for high speed Ethernet applications (e.g., 10 Gbps (Giga-bits per second) Ethernet operation according to the IEEE 802.3an (10 GBASE-T) emerging standard) as well as communication systems operating within a wireless context (e.g., in the IEEE 802.11 context space including the IEEE 802.11n emerging standard).

For any of these particular communication system application areas, near-capacity achieving error correction codes are very desirable. The latency constraints, which would be involved by using traditional concatenated codes, simply preclude their use in such applications in very high data rate communication system application areas.

Generally speaking, within the context of communication systems that employ LDPC codes, there is a first communication device at one end of a communication channel with encoder capability and second communication device at the other end of the communication channel with decoder capability. In many instances, one or both of these two communication devices includes encoder and decoder capability (e.g., within a bi-directional communication system). LDPC codes can be applied in a variety of additional applications as well, including those that employ some form of data storage (e.g., hard disk drive (HDD) applications and other memory storage devices) in which data is encoded before writing to the storage media, and then the data is decoded after being read/retrieved from the storage media.

BRIEF DESCRIPTION OF THE SEVERAL VIEWS OF THE DRAWINGS

FIG. 27 illustrates an embodiment of performance comparisons of various LDPC codes, each employing a respective header encoding approach, using SC signaling with an exponential decaying PDP Rayleigh fading communication channel QPSK modulation.

FIG. 28A illustrates an embodiment of a method for processing header information bits thereby generating a header.

FIG. 28B illustrates an embodiment of an alternatively method for processing header information bits thereby generating a header.

DETAILED DESCRIPTION OF THE INVENTION

Figure 1:
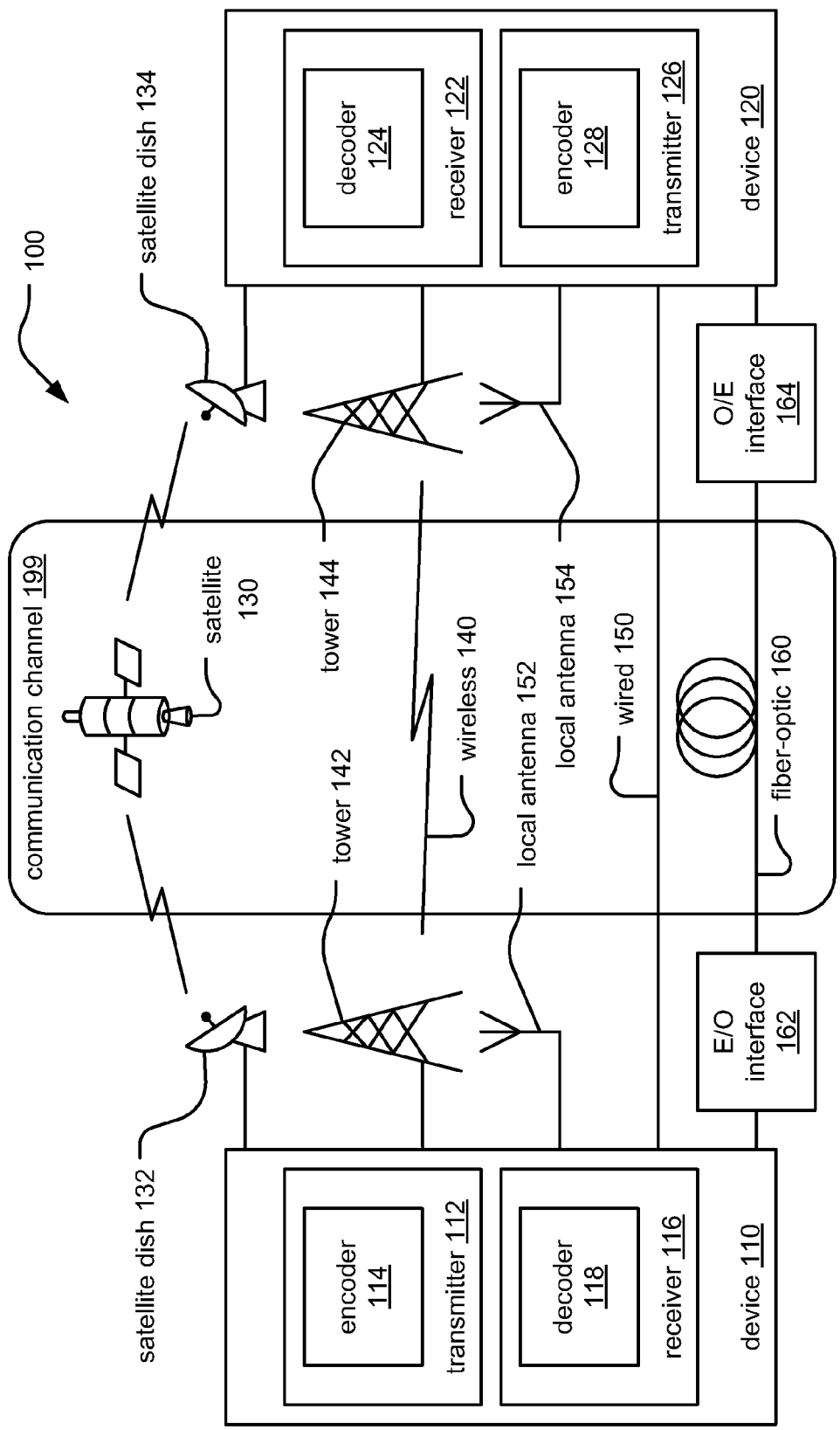
FIG. 1 and FIG. 2 illustrate various embodiments of communication systems.

The goal of digital communications systems is to transmit digital data from one location, or subsystem, to another either error free or with an acceptably low error rate. As shown in FIG. 1, data may be transmitted over a variety of communications channels in a wide variety of communication systems: magnetic media, wired, wireless, fiber, copper, and other types of media as well.

Figure 2:
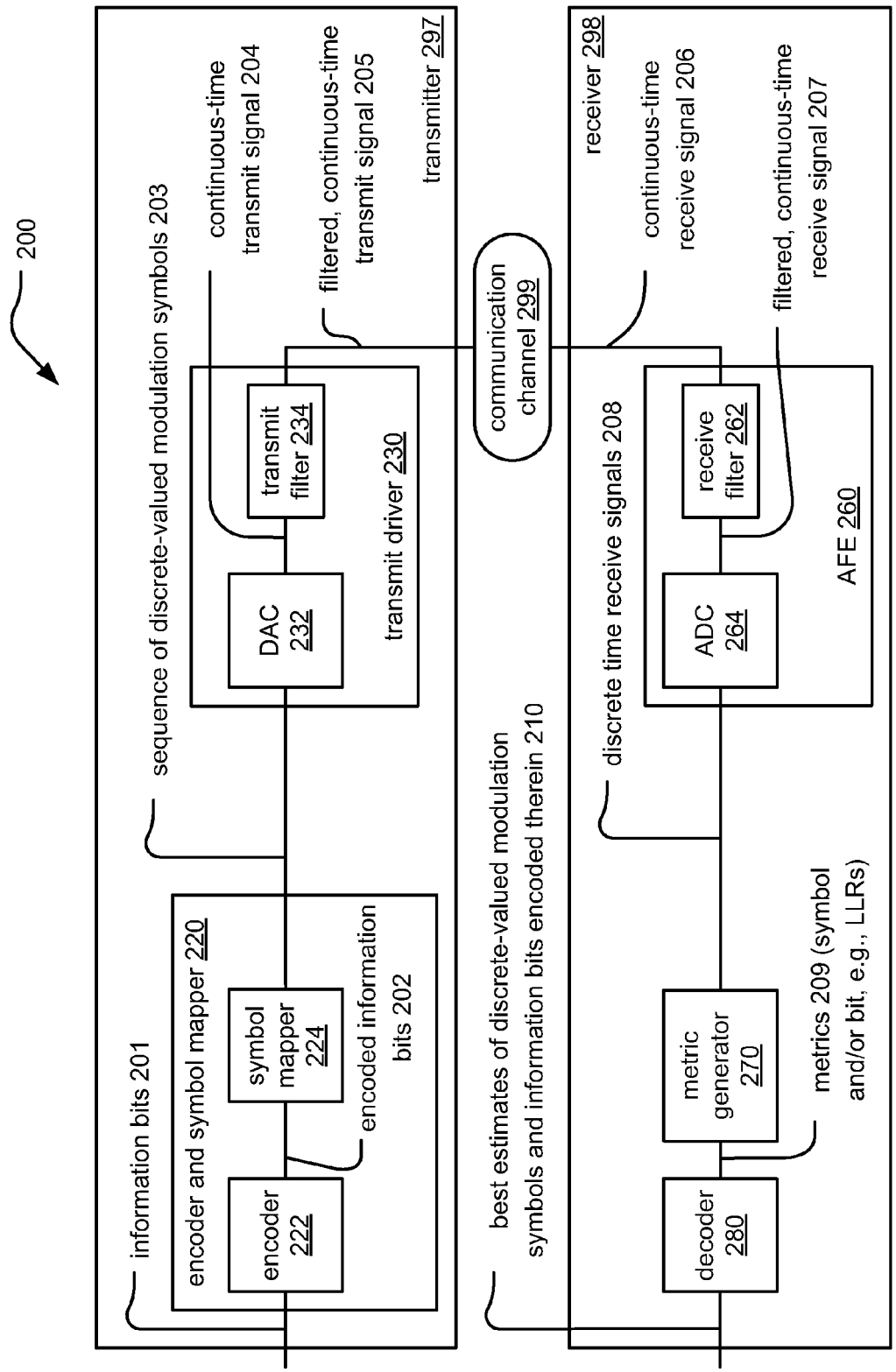

FIG. 1 and FIG. 2 are diagrams illustrate various embodiments of communication systems, 100 and 200, respectively.

Referring to FIG. 1, this embodiment of a communication system 100 is a communication channel 199 that communicatively couples a communication device 110 (including a transmitter 112 having an encoder 114 and including a receiver 116 having a decoder 118) situated at one end of the communication channel 199 to another communication device 120 (including a transmitter 126 having an encoder 128 and including a receiver 122 having a decoder 124) at the other end of the communication channel 199. In some embodiments, either of the communication devices 110 and 120 may only include a transmitter or a receiver. There are several different types of media by which the communication channel 199 may be implemented (e.g., a satellite communication channel 130 using satellite dishes 132 and 134, a wireless communication channel 140 using towers 142 and 144 and/or local antennae 152 and 154, a wired communication channel 150, and/or a fiber-optic communication channel 160 using electrical to optical (E/O) interface 162 and optical to electrical (O/E) interface 164)). In addition, more than one type of media may be implemented and interfaced together thereby forming the communication channel 199.

To reduce transmission errors that may undesirably be incurred within a communication system, error correction, and channel coding schemes are often employed. Generally, these error correction and channel coding schemes involve the use of an encoder at the transmitter and a decoder at the receiver. Of course, any such communication device implemented within such a communication system as described herein, or other type of communication system, may itself be transceiver type communication device that includes an encoder module therein for encoding signals to be transmitted (e.g., encoding information within signals), and also includes a decoder module therein for decoding signals that are received (e.g., decoding signals to make estimate of information encoded therein).

Any of the various types and embodiments of encoding and/or decoding described herein can be employed within any such desired communication system (e.g., including those variations described with respect to FIG. 1), any information storage device (e.g., hard disk drives (HDDs), network information storage devices and/or servers, etc.) or any application in which information encoding and/or decoding is desired.

Referring to the communication system 200 of FIG. 2, at a transmitting end of a communication channel 299, information bits 201 are provided to a transmitter 297 that is operable to perform encoding of these information bits 201 using an encoder and symbol mapper 220 (which may be viewed as being distinct functional blocks 222 and 224, respectively) thereby generating a sequence of discrete-valued modulation symbols 203 that is provided to a transmit driver 230 that uses a DAC (Digital to Analog Converter) 232 to generate a continuous-time transmit signal 204 and a transmit filter 234 to generate a filtered, continuous-time transmit signal 205 that substantially comports with the communication channel 299. At a receiving end of the communication channel 299, continuous-time receive signal 206 is provided to an AFE (Analog Front End) 260 that includes a receive filter 262 (that generates a filtered, continuous-time receive signal 207) and an ADC (Analog to Digital Converter) 264 (that generates discrete-time receive signals 208). A metric generator 270 calculates metrics 209 (e.g., on either a symbol and/or bit basis) that are employed by a decoder 280 to make best estimates of the discrete-valued modulation symbols and information bits encoded therein 210.

Moreover, one particular type of signal that is processed according to certain aspects and/or embodiments of the invention includes a frame composed of various fields including one of which that may be characterized as a header. Such header information included within a frame to be transmitted within a communication system in accordance with single carrier (SC) and/or orthogonal frequency division multiplexing (OFDM) signaling. This encoding of header information may be effectuated in accordance with shortening, puncturing, and/or repetition.

The decoders of either of the previous embodiments may be implemented to include various aspects and/or embodiment of the invention therein. In addition, several of the following Figures describe other and particular embodiments (some in more detail) that may be used to support the devices, systems, functionality and/or methods that may be implemented in accordance with certain aspects and/or embodiments of the invention. One particular type of signal that is processed according to certain aspects and/or embodiments of the invention is an LDPC coded signal. A general description of LDPC codes is provided below as well.

Figure 3:
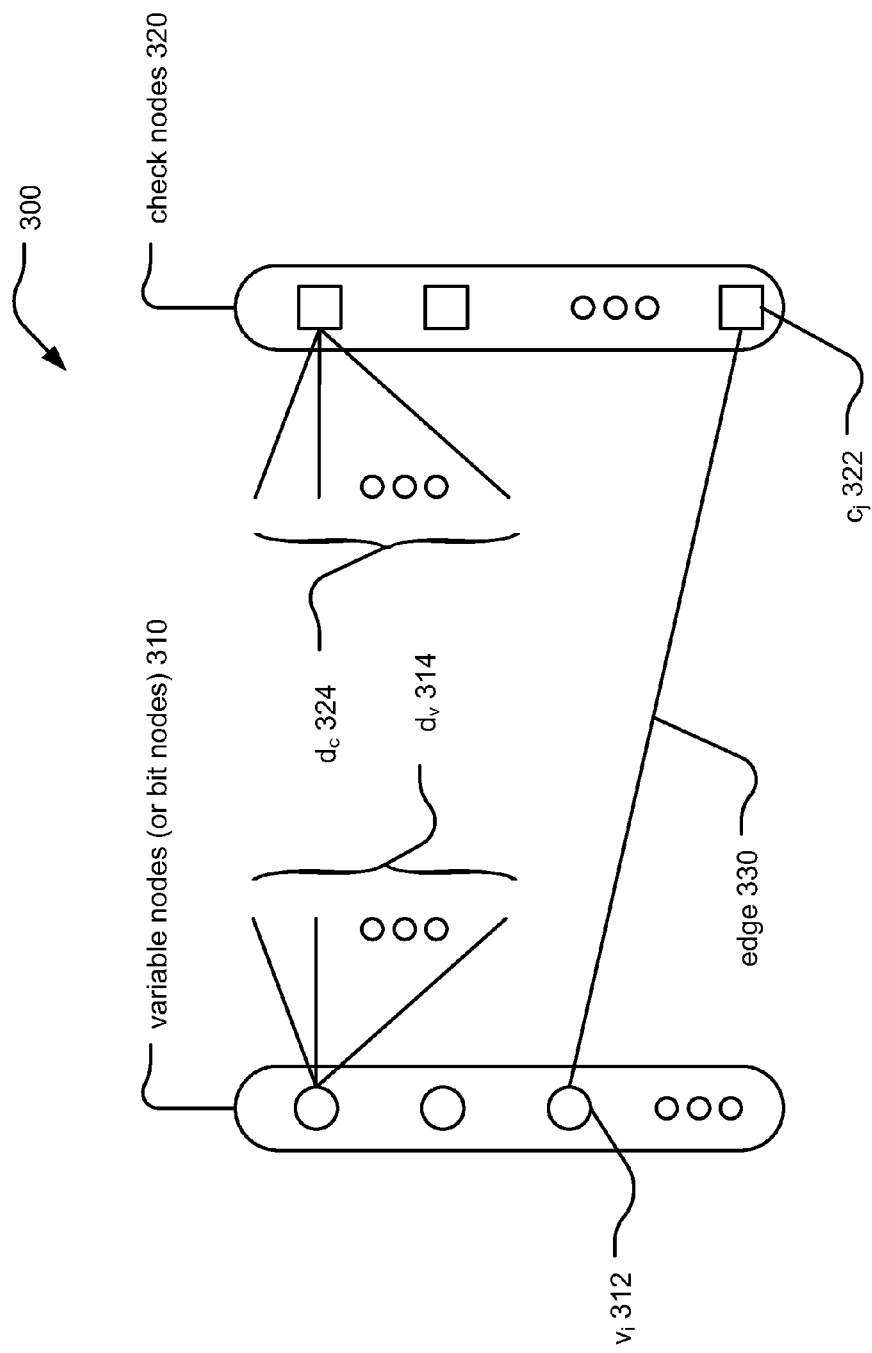
FIG. 3 illustrates an embodiment of an LDPC (Low Density Parity Check) code bipartite graph.

FIG. 3 illustrates an embodiment of an LDPC (Low Density Parity Check) code bipartite graph 300. In the art, an LDPC bipartite graph may also sometimes be referred to as a "Tanner" graph. An LDPC code may be viewed as being a code having a binary parity check matrix such that nearly all of the elements of the matrix have values of zeroes (e.g., the binary parity check matrix is sparse). For example, $H=(h_{i,j})_{M \times N}$ may be viewed as being a parity check matrix of an LDPC code with block length N.

LDPC codes are linear block codes and hence the set of all codewords x∈C spans the null space of a parity check matrix, H.

$$Hx^T = 0, \forall x \in C \qquad (1)$$

For LDPC codes, H, is a sparse binary matrix of dimension m×n. Each row of H corresponds to a parity check and a set element $h_{ij}$ indicates that data symbol j participates in parity check i. Each column of H corresponds to a codeword symbol.

For each codeword x there are n symbols of which m are parity symbols. Hence the code rate r is given by:

$$r = (n-m)/n \qquad (2)$$

The row and column weights are defined as the number of set elements in a given row or column of H, respectively. The set elements of H are chosen to satisfy the performance requirements of the code. The number of 1's in the i-th column of the parity check matrix, H, may be denoted as $d_v(i)$, and the number of 1's in the j-th row of the parity check matrix may be denoted as $d_c(j)$. If $d_v(i) = d_v$ for all i, and $d_c(j) = d_c$ for all j, then the LDPC code is called a ($d_v$, $d_c$) regular LDPC code, otherwise the LDPC code is called an irregular LDPC code.

LDPC codes were introduced by R. Gallager in [1] referenced below (also in [2] referenced below) and by M. Luby et al. in [3] also referenced below.

[1] R. Gallager, *Low-Density Parity-Check Codes,* Cambridge, Mass.: MIT Press, 1963.

[2] R. G. Gallager, "Low density parity check codes," *IRE Trans. Info. Theory,* vol. IT-8, January 1962, pp. 21-28.

[3] M. G. Luby, M. Mitzenmacher, M. A. Shokrollahi, D. A. Spielman, and V. Stemann, "Practical Loss-Resilient Codes," *Proc. 29th Symp. on Theory of Computing,* 1997, pp. 150-159.

A regular LDPC code can be represented as a bipartite graph 300 by its parity check matrix with left side nodes representing variable of the code bits (or alternatively as the "variable nodes" (or "bit nodes") 310 in a bit decoding approach to decoding LDPC coded signals), and the right side nodes representing check equations (or alternatively as the "check nodes" 320). The bipartite graph 300 (or sometimes referred to as a Tanner graph 300) of the LDPC code defined by H may be defined by N variable nodes (e.g., N bit nodes) and M check nodes. Every variable node of the N variable nodes 310 has exactly $d_v(i)$ edges (an example edge shown using reference numeral 330) connecting the bit node, $v_i$ 312, to one or more of the check nodes (within the M check nodes). The edge 330 is specifically shown as connecting from the bit node, $v_i$ 312, to the check node, $c_j$ 322. This number of $d_v$ edges (shown as $d_v$ 314) may be referred to as the degree of a variable node i. Analogously, every check node of the M check nodes 320 has exactly $d_c(j)$ edges (shown as $d_c$ 324) connecting this node to one or more of the variable nodes (or bit nodes) 310. This number of edges, $d_c$, may be referred to as the degree of the check node j.

An edge 330 between a variable node $v_i$ (or bit node $b_i$) 312 and check node $c_j$ 322 may be defined by e=(i, j). However, on the other hand, given an edge e=(i, j), the nodes of the edge may alternatively be denoted as by e=(v(e),c(e)) (or e=(b(e), c(e))). Alternatively, the edges in the graph correspond to the set elements of H where a set element $h_{ji}$ indicates that an edge connects a bit (e.g., variable) node i with parity check node j.

Given a variable node $v_i$ (or bit node $b_i$), one may define the set of edges emitting from the node $v_i$ (or bit node $b_i$) by $E_v(i)=\{e|v(e)=i\}$ (or by $E_b=\{e|b(e)=i\}$); these edges are referred to as bit edges, and the messages corresponding to these bit edges are referred to as bit edge messages.

Given a check node $c_j$, one may define the set of edges emitting from the node $c_j$ by $E_c(j)=\{e|c(e)=j\}$; these edges are referred to as check edges, and the messages corresponding to these check edges are referred to as check edge messages. Continuing on, the derivative result will be $|E_v(i)|=d_v$ (or $|E_b(i)|=d_b$) and $|E_c(j)|=d_c$.

Generally speaking, any codes that can be represented by a bipartite graph may be characterized as a graph code. It is also noted that an irregular LDPC code may also described using a bipartite graph. However, the degree of each set of nodes within an irregular LDPC code may be chosen according to some distribution. Therefore, for two different variable nodes, $v_{i_1}$ and $v_{i_2}$, of an irregular LDPC code, $|E_v(i_1)|$ may not equal to $|E_v(i_2)|$. This relationship may also hold true for two check nodes. The concept of irregular LDPC codes was originally introduced within M. Luby et al. in [3] referenced above.

In general, with a graph of an LDPC code, the parameters of an LDPC code can be defined by a degree of distribution, as described within M. Luby et al. in [3] referenced above and also within the following reference [4]:

[4] T. J. Richardson and R. L. Urbanke, "The capacity of low-density parity-check code under message-passing decoding," *IEEE Trans. Inform. Theory*, Vol. 47, No. 2, February 2001, pp. 599-618.

This distribution may be described as follows:

Let $\lambda_i$ represent the fraction of edges emanating from variable nodes of degree i and let $\rho_i$ represent the fraction of edges emanating from check nodes of degree i. Then, a degree distribution pair $(\lambda,\rho)$ is defined as follows:

$$\lambda(x) = \sum_{i=2}^{M_v} \lambda_i x^{i-1} \text{ and } \rho(x) = \sum_{i=2}^{M_c} \rho_i x^{i-1},$$

where $M_v$ and $M_c$ represent the maximal degrees for variable nodes and check nodes, respectively.

While many of the illustrative embodiments described herein utilize regular LDPC code examples, it is noted that certain aspects and/or embodiments of the invention are also operable to accommodate both regular LDPC codes and irregular LDPC codes.

It is also noted that many of the embodiments described herein employ the terminology of "bit node" and "bit edge message", or equivalents thereof. Oftentimes, in the art of LDPC decoding, the "bit node" and "bit edge message" are alternatively referred to as "variable node" and "variable edge message", in that, the bit values (or variable values) are those which are attempted to be estimated. Either terminology can be employed in accordance with certain aspects of the invention.

Figure 4:
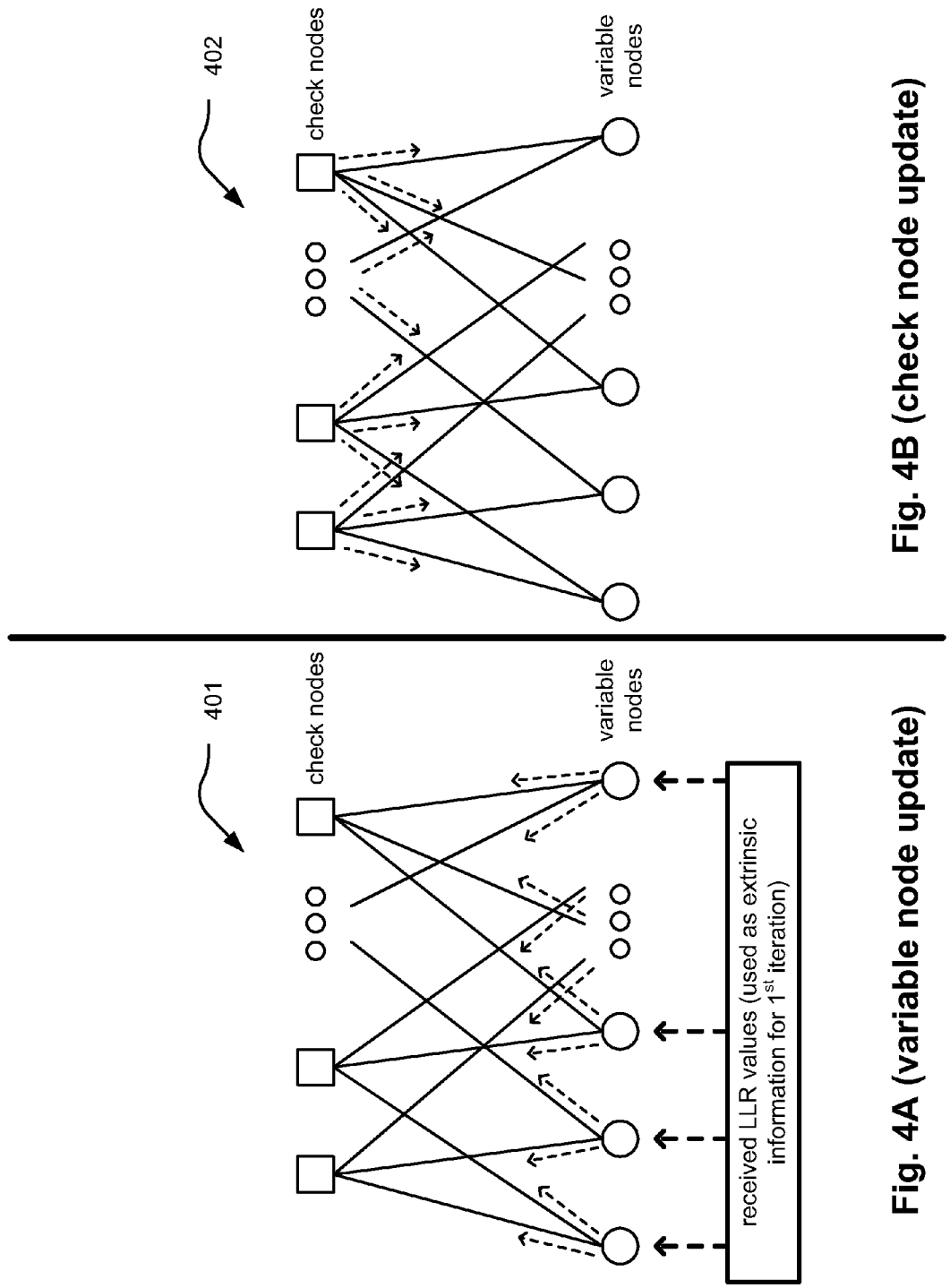
FIG. 4A illustrates an embodiment of variable node update with reference to an LDPC code bipartite graph.
FIG. 4B illustrates an embodiment of check node update with reference to an LDPC code bipartite graph.

FIG. 4A illustrates an embodiment 401 of variable node update with reference to an LDPC code bipartite graph. FIG. 4B illustrates an embodiment 402 of check node update with reference to an LDPC code bipartite graph. These two diagrams may be considered in conjunction with one another.

A signal received from a communication channel undergoes appropriate demodulation (e.g., processing within an analog front end including digital sampling, filtering, gain adjustment, etc.) to generate a received bit sequence. Then, log-likelihood ratios (LLRs) are calculated for each bit location within the received bit sequence. These LLRs correspond respectively to bit nodes of the LDPC code and its corresponding LDPC bipartite graph.

During initialization, the LLRs are employed for the bit edge messages (e.g., extrinsic information) for each edge emanating from each respective variable node. Thereafter, check node processing or check node updating is performed using the original bit edge messages (e.g., the calculated LLRs). These updated check edge messages are then employed to perform bit node processing or bit node updating to update the variable node soft information for use in the next decoding iteration. The variable node soft information is then used to calculate the variable node edge messages (extrinsic information) for this next decoding iteration.

These variable node edge messages are then used in accordance with check node processing or check node updating to calculate updated check edge messages. Subsequently, these most recently updated check edge messages are then employed to perform bit node processing or bit node updating to update the variable node soft information once again.

After a final decoding iteration, which may be determined based on some parameter (e.g., a predetermined number of decoding iterations or when all syndromes of the LDPC code equal zero), the last calculated variable node soft information may undergo hard limiting (e.g., in a slicer) to generate estimates of the bits encoded within the received signal.

Figure 5:
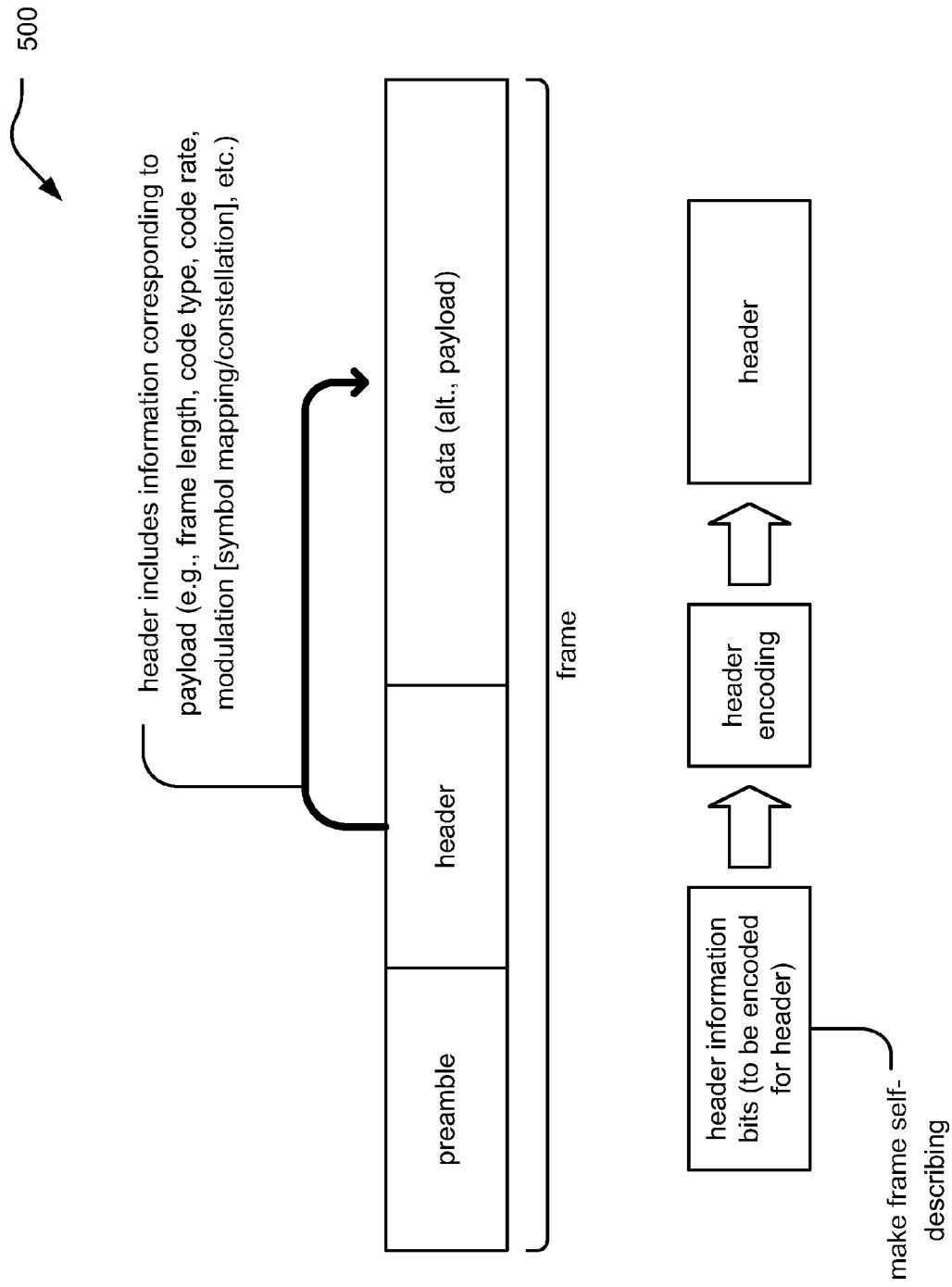
FIG. 5 illustrates an embodiment of a frame showing the respective portions of preamble, header, and data therein.

FIG. 5 illustrates an embodiment 500 of a frame showing the respective portions of preamble, header, and data therein. A frame, such as a physical layer frame, that gets transmitted from a communication device into a communication channel may have the form as described in this diagram. While many of the frames described herein are described with reference to a digital format, it is of course noted that a digital signal may undergo a variety of processing (e.g., digital to analog conversion, frequency conversion, filtering [analog or digital], scaling, etc.) to generate a continuous time signal that is launched into the communication channel.

In this diagram, the frame includes a preamble, a header, and data (alternatively referred to as the payload portion of the frame). The data generally includes the actually information to be transmitted from a first location to a second location.

The preamble includes a set of sequences (which may be repetitive) for a variety of applications including: initial frame/burst detection, carrier frequency acquisition, automatic gain control (AGC), timing recovery, channel estimation, noise/interference estimation, and/or information employed for other applications.

In one design, the preamble may be the same for both the single carrier (SC) modulation and orthogonal frequency division multiplexing (OFDM) PHY modes of operation. The preamble may be encoded as a set of Golay sequences (or other sequences with good correlation properties) encoded using BPSK followed by ±π/2 (e.g., ±90°) rotation per symbol.

Header information bits undergo encoding (e.g., using the same type of code, or variant of the same base code, as is employed to encode the data) to form the "header". The header may be encoded/modulated using either SC modulation or OFDM. OFDM uses a certain number of data sub-carriers (e.g., 336) and a certain number of pilots/fixed sub-carriers (e.g., 16). In comparison, SC modulation may use binary phase shift keying (BPSK) modulation with ±π/2 (e.g., ±90°) rotation per symbol. The header information bits (that undergo encoding to form the header) include all information required to make a frame self-describing. For example, the include information corresponding to modulation/coding set for the data field (e.g., code rate, code type, constellation/mapping, etc.), the length of the data in octets or time duration, and/or any additional training information (such as may be employed in accordance with beamforming in certain wireless contexts such as multiple input multiple output (MIMO) communication systems). The data field may be modulated using either SC modulation or OFDM using any of a variety of possible constellations and mappings.

A novel means is presented herein for generating the header that allows for providing a flexible header bits size for both SC (single carrier) and orthogonal frequency division multiplexing (OFDM) physical layer (PHY). The final output size of the header may be targeted to be a predetermined size (e.g., generally X bits, or specific values such as 448 bits for a SC PHY and 672 bits for an OFDM PHY. The OFDM header and SC header encodings are aligned (e.g., use the rate 3/4 of size 672 LDPC code as base code for both models).

In the OFDM PHY, the preamble is followed by the PLOP header (e.g., shown as header in the diagram). The PLCP header consists of several fields which define the details of the physical layer (PHY) protocol data unit (PPDU) being transmitted. The encoding and modulation of the header in accordance with any means or equivalent presented herein. Once embodiment of the header fields are described in the following Table relating to OFDM.

TABLE

OFDM Header Fields

| Field Name | Number of bits | Start Bit | Description |
| --- | --- | --- | --- |
| Scrambler Initialization | 7 | 0 | bits X1-X7 of the initial scrambler state. |
| MCS | 5 | 7 | Index into the Modulation and Coding Scheme table |
| Length | 18 | 12 | Number of data octets in the PSDU. Range 0-262143 |

TABLE-continued

OFDM Header Fields

| Field Name | Number of bits | Start Bit | Description |
| --- | --- | --- | --- |
| Additional PPDU | 1 | 30 | A value of 1 Indicates that this PPDU is immediately followed by another PPDU with no IFS or preamble on the subsequent PPDU. A value of 0 indicates that no additional PPDU follows this PPDU. |
| Packet Type | 2 | 31 | packet type: 0—regular packet 1—TRN-R packet 2—TRN-T packet 3—Reserved |
| Training Length | 5 | 33 | Length of the training field |
| Aggregation | 1 | 38 | Set to 1 to indicate that the PPDU in the data portion of the packet contains an AMPDU; otherwise, set to 0. |
| Reserved | 9 | 39 | Set to 0, ignored by receiver. |
| HCS | 16 | 48 | Header check sequence |

In this embodiment described above, all the numeric fields are encoded in unsigned binary, least significant bit first.

Alternatively, in an embodiment including the SC PHY, the preamble is followed by the PLCP header (e.g., shown as header in the diagram). The PLCP header consists of several fields which define the details of the physical layer (PHY) protocol data unit (PPDU) being transmitted. The encoding and modulation of the header in accordance with any means or equivalent presented herein. Once embodiment of the header fields are described in the following Table relating to the SCM PHY.

TABLE

SCM Header Fields

| Field Name | Number of bits | Start Bit | Description |
| --- | --- | --- | --- |
| Scrambler Initialization | 7 | 0 | Bits X1-X7 of the initial scrambler state |
| MCS | 5 | 7 | Index into the Modulation and Coding Scheme table |
| Length | 18 | 12 | Number of data octets in the PSDU. Range 0-262143 |
| Additional PPDU | 1 | 30 | A value of 1 Indicates that this PPDU is immediately followed by another PPDU with no IFS or preamble on the subsequent PPDU. A value of 0 indicates that no additional PPDU follows this PPDU. |
| Packet Type | 2 | 31 | packet type: 0—regular packet 1—TRN-R packet 2—TRN-T packet 3—Reserved |
| Training Length | 4 | 33 | Length of the training field |
| Reserved | 1 | 37 | Set to 0, ignored by receiver. |
| Aggregation | 1 | 38 | Set to 1 to indicate that the PPDU in the data portion of the packet contains an AMPDU; otherwise, set to 0. |
| Reserved | 9 | 39 | Set to 0, ignored by receiver. |
| HCS | 16 | 48 | Header check sequence |

Also in this embodiment described above, all the numeric fields are encoded in unsigned binary, least significant bit first.

Figure 6:
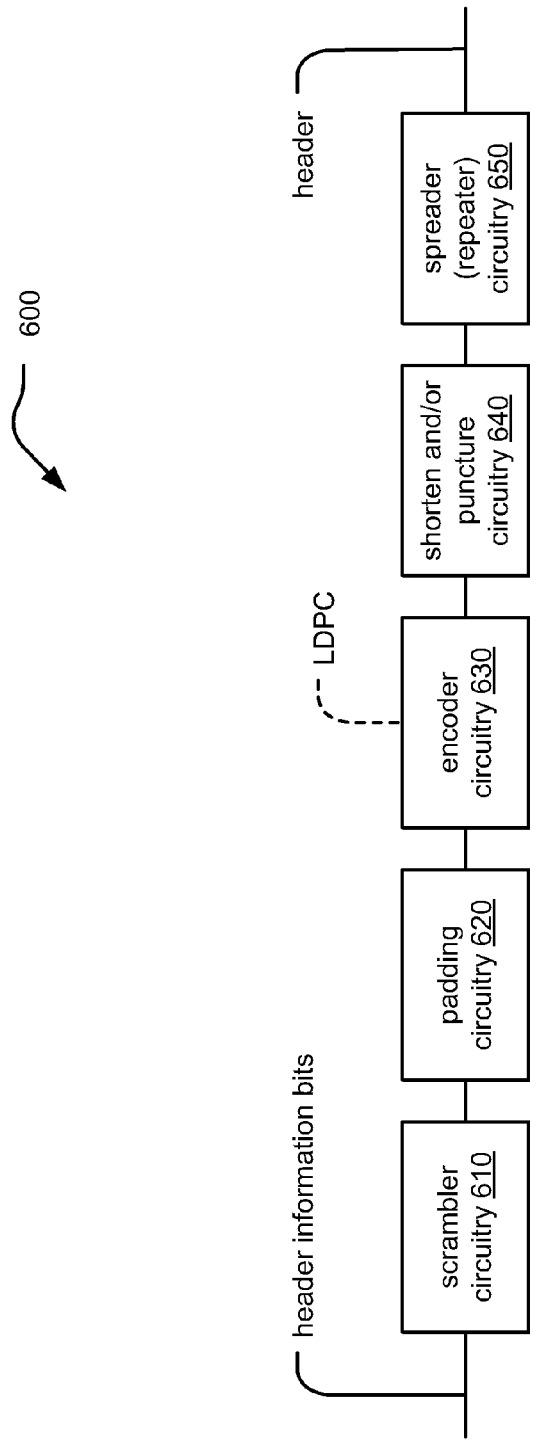
FIG. 6 illustrates an embodiment of an apparatus that is operative to process header information bits thereby generating a header.

FIG. 6 illustrates an embodiment of an apparatus 600 that is operative to process header information bits thereby generating a header. Header information bits (e.g., those bits that includes all appropriate information to make the frame self-describing—such as those parameter described above) may be provided to a scrambler circuitry 610. After being scrambled in the scrambler circuitry 610 (using some scrambling pattern—one pattern/option of which may involve no scrambling whatsoever), these bits are then provided to a padding circuitry 620 that is operative to place at least one pad bit (e.g., a 0-valued bit) therein. The placement of where the at least one pad bit is emplaced within the bits provided to the padding circuitry 620 may be varied in different embodiments (e.g., at beginning, at end, interspersed throughout, etc.).

An encoder circuitry 630 operates by encoding padded bit block (output from the padding circuitry 620) thereby generating coded bits. Any of a variety of types of codes (e.g., an LDPC code) may be employed by the encoder circuitry 630. A shorten and/or puncture circuitry 640 may operate on the coded bits by shortening coded bits (e.g., removing padded bits) thereby generating shortened coded bits. The shortened and/or puncture circuitry 640 may also operate by puncturing at least one bit from the shortened coded bits thereby generating punctured bits. These punctured bits are passed to a spreader (repeater) 650 that is operative to perform spreading (e.g., combining, repeating, etc.) the punctured bits thereby generating a header to be emplaced within a frame to be transmitted from a communication device via a communication channel.

Figure 7:
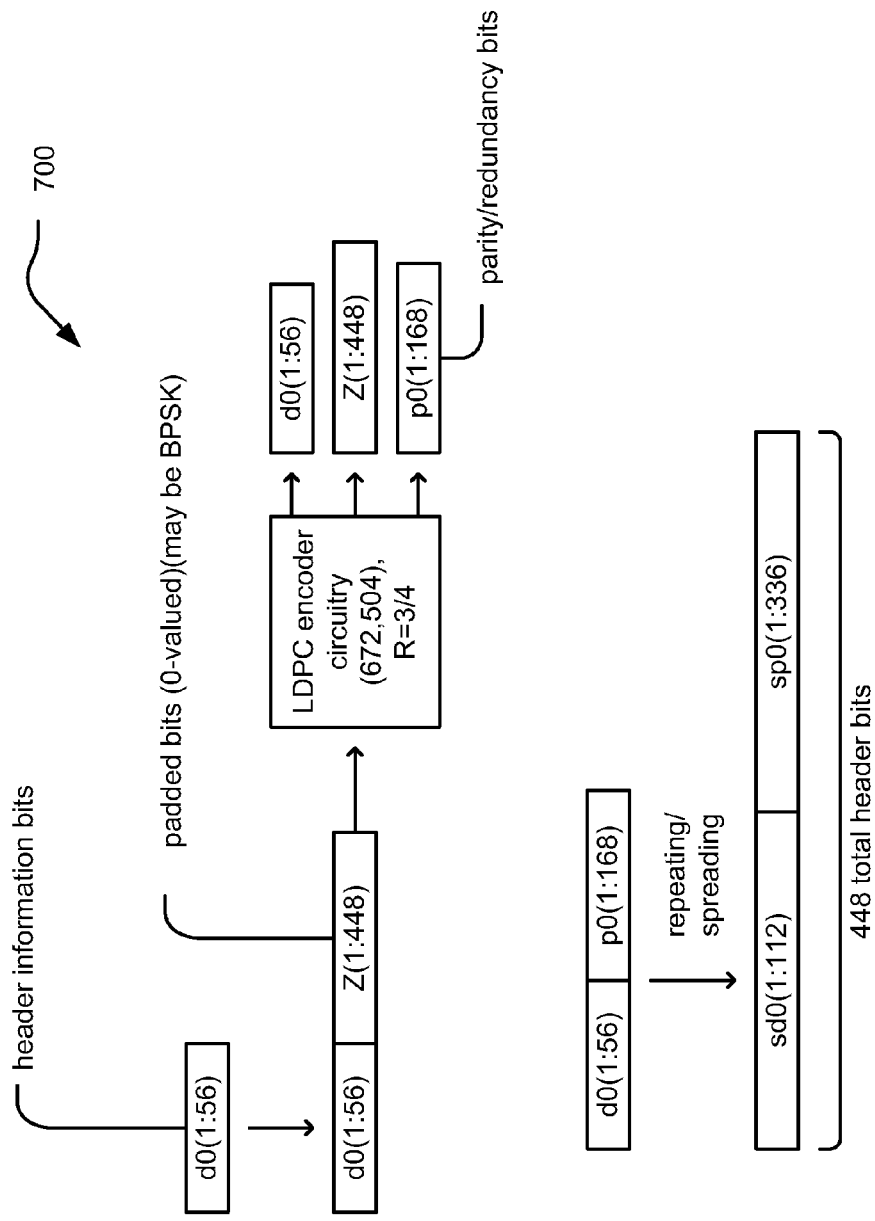
FIG. 7 illustrates an embodiment of an apparatus that is operative to process header information bits thereby generating a header in accordance with an effective coding rate of 1/8 for use in a physical layer (PHY) frame to be transmitted in accordance with single carrier (SC) signaling.

FIG. 7 illustrates an embodiment of an apparatus 700 that is operative to process header information bits thereby generating a header in accordance with an effective coding rate of 1/8 for use in a physical layer (PHY) frame to be transmitted in accordance with single carrier (SC) signaling. This diagram shows an encoding scheme for generating an SC header beginning with 56 header information bits such that the encoding is performed in accordance with an effective rate 1/8.

These 56 header information bits undergo scrambling. Thereafter, a certain number of bits are padded thereto, and these bits then undergo encoding with a (224, 56) LDPC code that is generated by shortening a (672, 504) rate 3/4 LDPC code. After the padded bits are removed from the coded bits output from the LDPC encoder circuitry. A spreading/repeating of these remaining bits is made using factor of 2. The effective code rate is 56/448=1/8.

Figure 8:
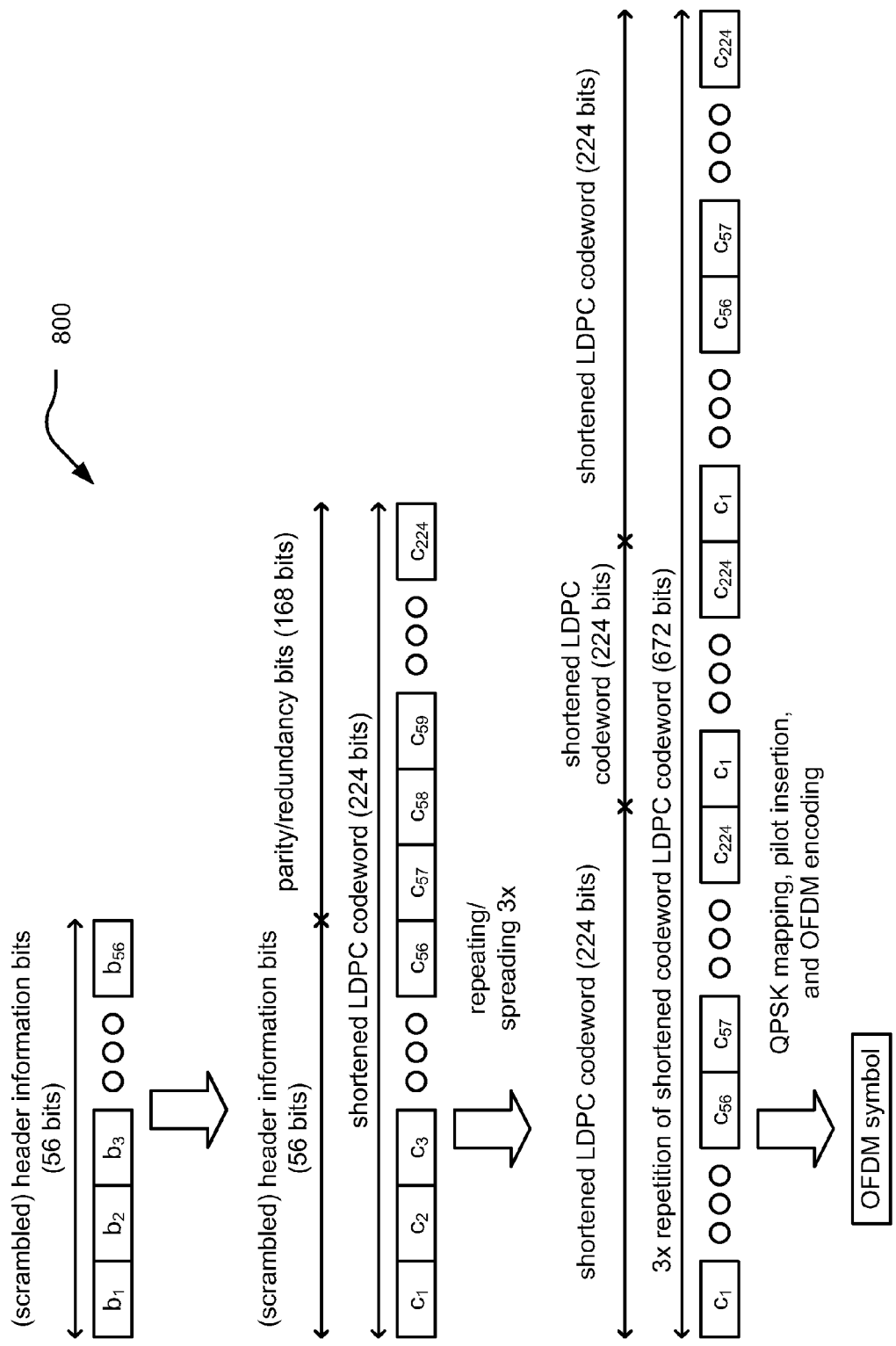
FIG. 8 illustrates an embodiment of an apparatus that is operative to process header information bits thereby generating a header in accordance with an effective coding rate of 1/12 for use in a PHY frame to be transmitted in accordance with orthogonal frequency division multiplexing (OFDM) signaling.

FIG. 8 illustrates an embodiment of an apparatus 800 that is operative to process header information bits thereby generating a header in accordance with an effective coding rate of 1/12 for use in a PHY frame to be transmitted in accordance with orthogonal frequency division multiplexing (OFDM) signaling. In some respects, the header encoding is similar to the previous embodiment described with reference to FIG. 7, with at least one difference being that the spreading/repetition is performed using a factor of 3 (vs. 2 of the previous embodiment). This diagram shows an encoding scheme for generating an OFDM header that is generated beginning with 56 information bits and operates in accordance with an effective rate of 1/12.

In some embodiments, it may be desirable to employ more header information bits (e.g., more than 56 header information bits). For example, in some embodiments, to include information to describe all of the details corresponding to the date of the frame, a larger number of header information bits may be required.

Figure 9:
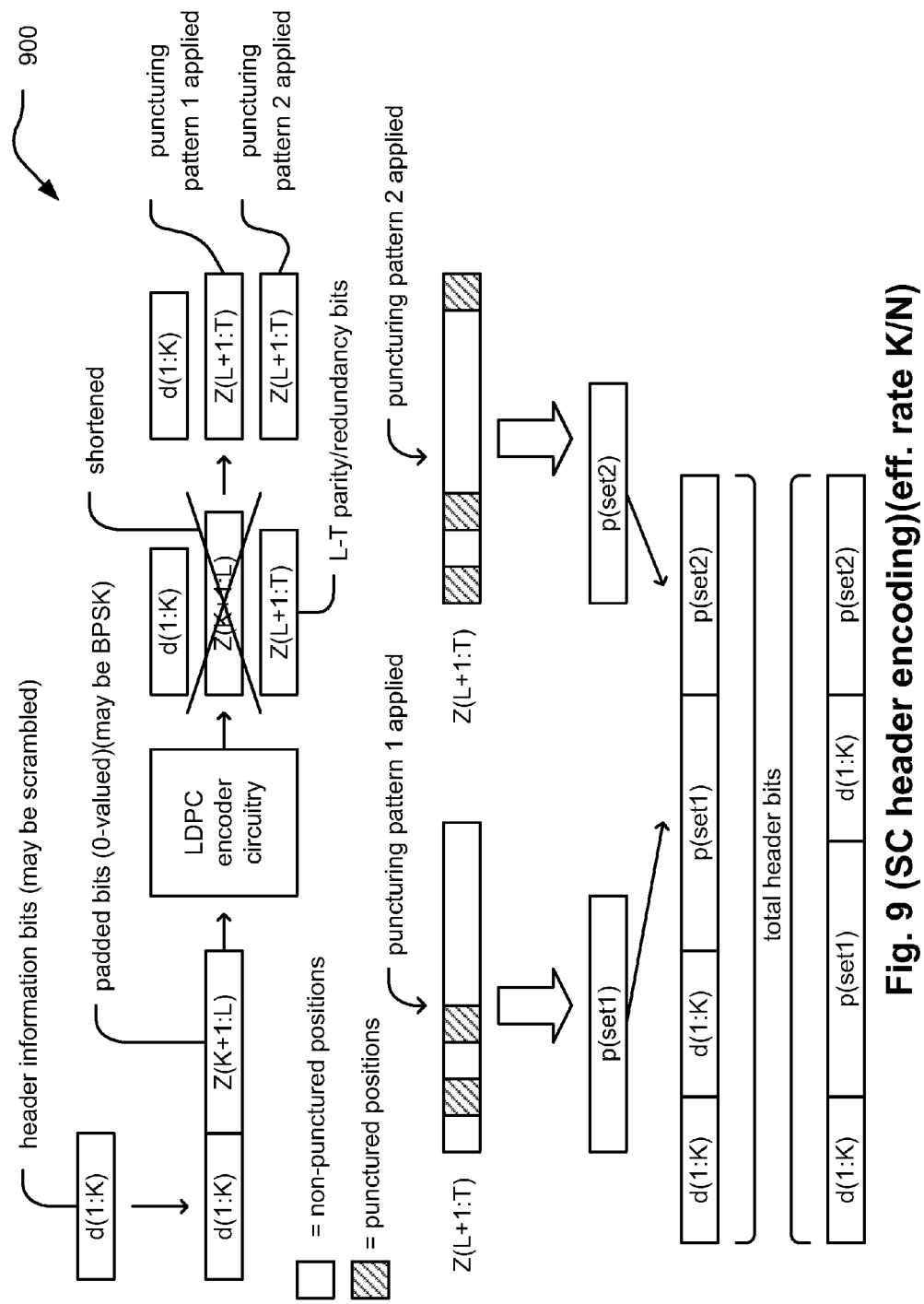
FIG. 9 illustrates an embodiment of an apparatus that is operative to process header information bits thereby generating a header in accordance with an effective coding rate of K/N (K and N integers) for use in a PHY frame to be transmitted in accordance with SC signaling.

FIG. 9 illustrates an embodiment of an apparatus 900 that is operative to process header information bits thereby generating a header in accordance with an effective coding rate of K/N (K and N integers) for use in a PHY frame to be transmitted in accordance with SC signaling. In certain of previous embodiments, only shortening and repetition are employed. However, selective puncturing is also employed herein, and that puncturing is applied in a manner that allows for a relatively low performance impact of the encoding performed in the generation of the header.

For example, when more header information bits are employed (e.g., those bits that include the information that are operative to make a frame self-describing), and when a fixed output size of the eventually generated header is desirable while still employing the same base LDPC code, then selective puncturing may also be performed in accordance with the header encoding technique to the header encoding scheme. This selective puncturing may employ multiple puncturing patterns as applied to various portions of a group of bits. For example, the selective puncturing may be applied to parity/redundancy bits, to copies/duplicated portions of those parity/redundancy bits (as may be generated in accordance with repetition/spreading), to the original header information bits themselves, and/or to copies/duplicated portions of those information bits themselves.

SC PHY Header

Rather than employing a 2 time repetition of a single shortened LDPC codeword (e.g., as generated by an LDPC encoder), 2 copies of shortened and punctured LDPC codewords with 2 different puncturing patterns applied thereto may instead be employed. Of course, generally speaking, N copies of shortened and punctured LDPC codewords with N different puncturing patterns applied thereto may instead be employed (N being an integer).

OFDM PHY Header

Rather than employing a 3 time repetition of a single shortened LDPC codeword (e.g., as generated by an LDPC encoder), 3 copies of shortened and punctured LDPC codewords with 3 different puncturing patterns applied thereto may instead be employed. Of course, generally speaking, N copies of shortened and punctured LDPC codewords with N different puncturing patterns applied thereto may instead be employed (N being an integer).

With respect to any embodiment of the SC PHY header and OFDM PHY header presented herein, it is noted that any desired means of combination of the bits may be made to generate the final header (e.g., rearranging of the bits in accordance with scrambling, interleaving, etc. including switching the order of any two or more bits; the order in which the header information bits, the remaining/non-punctured bits [whether they be header information bits or parity/redundancy bits] may be emplaced in the final formed header in accordance with any desired manner or order as a particular embodiment or implementation would prefer or require. For example, while many of the embodiments presented herein, the header information bits (which are repeated) are followed by the parity/redundancy bits (which are also repeated). However, the order in which these bits are included to form the final header may also be changed without departing from the scope and spirit of the invention (e.g., parity/redundancy bits firstly followed by the header information bits; alternatively: header information bits followed by parity/redundancy bits then followed by a copy/duplicate of the header information bits then followed by a copy/duplicate of the parity/redundancy bits).

Decoding

In a receiver communication device, a same decoder that is operative to perform decoding of a base LDPC code may also be employed to perform header decoding of each of a SC PHY header and an OFDM PHY header. In other words, by appropriate design and implementation of the headers (be they in accordance with SC or OFDM signaling), a single decoder may be provisioned to decode not only the various types of headers generated thereby but also the data portions of corresponding frames that have been generated in accordance with LDPC encoding as well.

In accordance with decoding, metrics or log-likelihood ratios (LLRs) (e.g., see metric generation operations with reference to FIG. 2) of repetition bits are combined (summed) with a proper scaling. Because different puncturing patterns are applied to different portions of a group of bits (e.g., that applies a first puncturing pattern to the original portion of the group of bits and a second puncturing pattern to a copied/duplicated portion of the group of bits), then intelligent combination of the LLRs may be made to recoup any coding loss that may have been incurred by the puncturing applied.

In accordance with decoding processing, the LLRs of shortened bits are known (e.g., because they correspond to bits have predetermined values such as being 0-valued bits). As such, they may be assigned to a fixed/predetermined value. Because all of the shortened bits are typically assigned a common value (e.g., bit value of 0), the LLRs corresponding thereto may all be assigned to the same fixed/predetermined value.

However, because the values of the punctured bits are unknown, the LLRs corresponding thereto are unknown and may all be assigned a predetermined value (e.g., 0). However, by using the different puncturing patterns for different repetition blocks, any unknown LLR may be avoided after combining with LLRs generated by other repetition blocks.

With these new approaches, comparing to the previous art the new encoding schemes with longer information bits will have better or equal performance after offsetting the effective code rate gain.

In the embodiment of FIG. 9, certain parameters are given including: the output size of SC header encoding=N bits (e.g., N=448), and the rate R (L,T) LDPC code, say LDPC(R), where L is the block size and T is the size of information bits.

The K header information bits (where $K \leq T$) may undergo scrambling thereby generating the bits $d(1), \ldots, d(K)$ that then undergo padding. After padding T−K 0 bits thereto (e.g., shown as $z(K+1), \ldots, z(T)$ 0-valued bits that are padded after the K information bits (shortening)), then these K header information bits and the padded bits are provided to an LDPC encoder circuitry. Of course, it is noted that zero-valued bits (e.g., padded bits) are not transmitted via the communication channel (e.g., on the air in a wireless communication channel embodiment).

The LDPC encoder circuitry is operative to encode $d(1), \ldots, d(K), z(K+1), \ldots, z(T)$ using an LDPC code, LDPC(R), to get L-T parity/redundancy bits, shown as $p(1), \ldots, p(L-T)$.

Two separate and distinct puncturing patterns are employed, depicted as punc[1] and punc[2], respectively, on L-T parity bits, respectively, to get two sub-sequences of parity bits, say $p(set1)=\{p(i_1), p(i_2), \ldots, p(i_a)\}, p(set2)=\{p(j_1), p(j_2), \ldots, p(j_b)\}$ such that 2×K+a+b=N. It is noted that punc[1] is a subset of $\{1, \ldots, L-T\}$ of size L-T-a, and punc[2] is a subset of $\{1, \ldots, L-T\}$ of size L-T-b. The output duplicated information bits, e.g., $d(1), \ldots, d(K), d(1), \ldots, d(K)$, are followed by p(set1) and p(set2). The effective code rate of such a header encoding approach is K/N.

While this embodiment shows an example of combining the bits (e.g., using a spreading circuitry) to generate the header by employing the information bits, e.g., $d(1), \ldots, d(K), d(1), \ldots, d(K)$, are followed by p(set1) and p(set2), as described above, with respect to any embodiment of the SC PHY header and OFDM PHY header presented herein. In an alternative embodiment, the header is generated by employing the information bits, e.g., $d(1), \ldots, d(K)$ followed by p(set1), followed by a duplicate of the information bits, $d(1), \ldots, d(K)$, and then followed by p(set2).

It is again noted that any desired means of combination of the bits may be made to generate the final header (e.g., rearranging of the bits in accordance with scrambling, interleaving, etc. including switching the order of any two or more bits; the order in which the header information bits, the remaining/non-punctured bits [whether they be header information bits or parity/redundancy bits] may be emplaced in the final formed header in accordance with any desired manner or order as a particular embodiment or implementation would prefer or require. For example, while many of the embodiments presented herein, the header information bits (which are repeated) are followed by the parity/redundancy bits (which are also repeated). However, the order in which these bits are included to form the final header may also be changed without departing from the scope and spirit of the invention (e.g., parity/redundancy bits firstly followed by the header information bits; alternatively: header information bits followed by parity/redundancy bits then followed by a copy/duplicate of the header information bits then followed by a copy/duplicate of the parity/redundancy bits).

Figure 10:
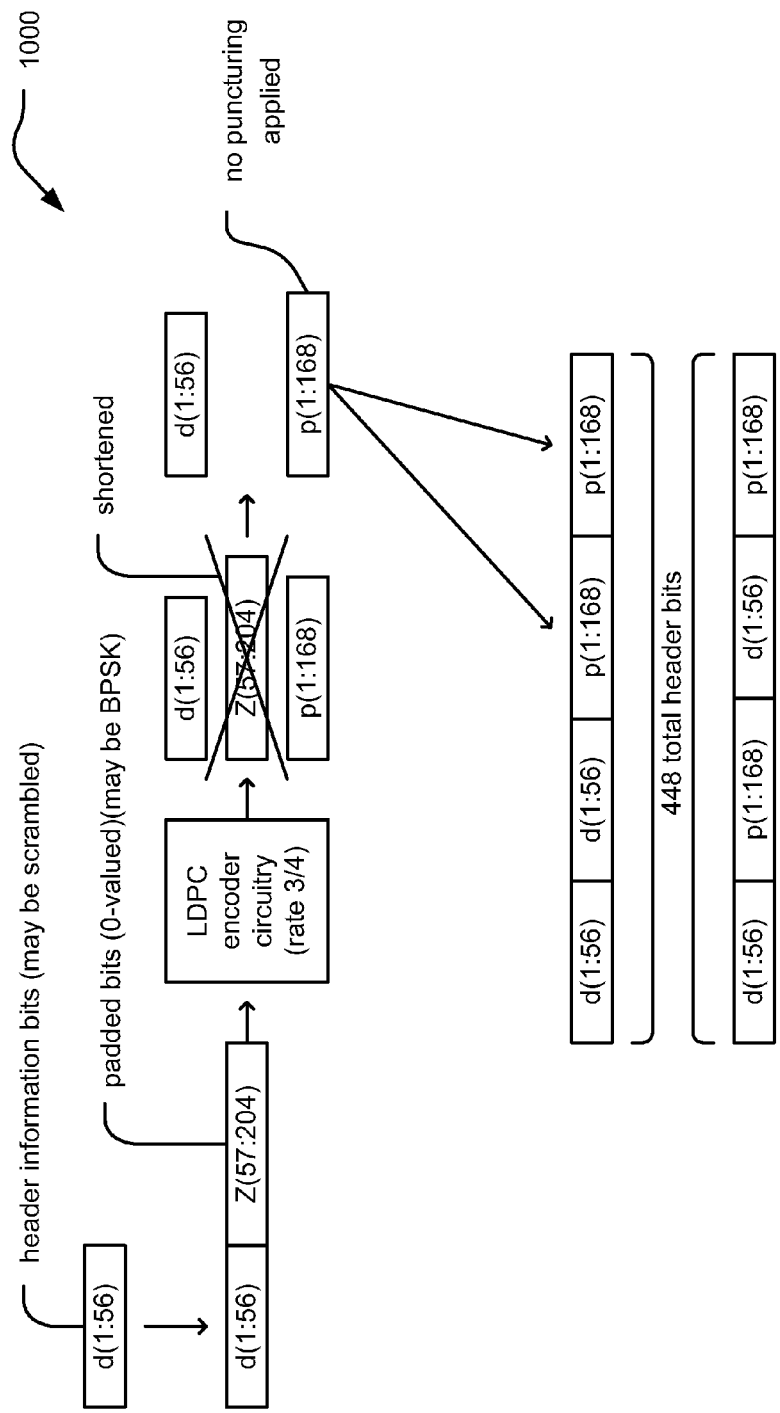
FIG. 10 illustrates an alternative embodiment of an apparatus that is operative to process header information bits thereby generating a header in accordance with an effective coding rate of 1/8 for use in a PHY frame to be transmitted in accordance with SC signaling.

FIG. 10 illustrates an alternative embodiment of an apparatus 1000 that is operative to process header information bits thereby generating a header in accordance with an effective coding rate of 1/8 for use in a PHY frame to be transmitted in accordance with SC signaling. This embodiment employs no puncturing therein, and consequently no selective puncturing therein that applied different puncturing patterns to different portions of the block. This embodiment may be referred to as SC header encoding example 1 as having an effective rate 1/8, K=56, N=448, (672, 504) LDPC code. Again, no puncturing is performed in this embodiment, i.e. punc[1]=punc[2]=Ø.

One embodiment forms the header (e.g., by using a spreader circuitry) by employing the information bits, e.g., $d(1), \ldots, d(56), d(1), \ldots, d(56)$, followed by $p(1), \ldots, p(168)$ and $p(1), \ldots, p(168)$. However, in an alternative embodiment, the header is generated by employing the information bits, e.g., $d(1), \ldots, d(56)$ followed by $p(1), \ldots, p(168)$, then followed by a duplicate of the information bits, $d(1), \ldots, d(56)$, and then followed by $p(1), \ldots, p(168)$. Again, any desired means of combination of the bits may be made to generate the final header.

Figure 11:
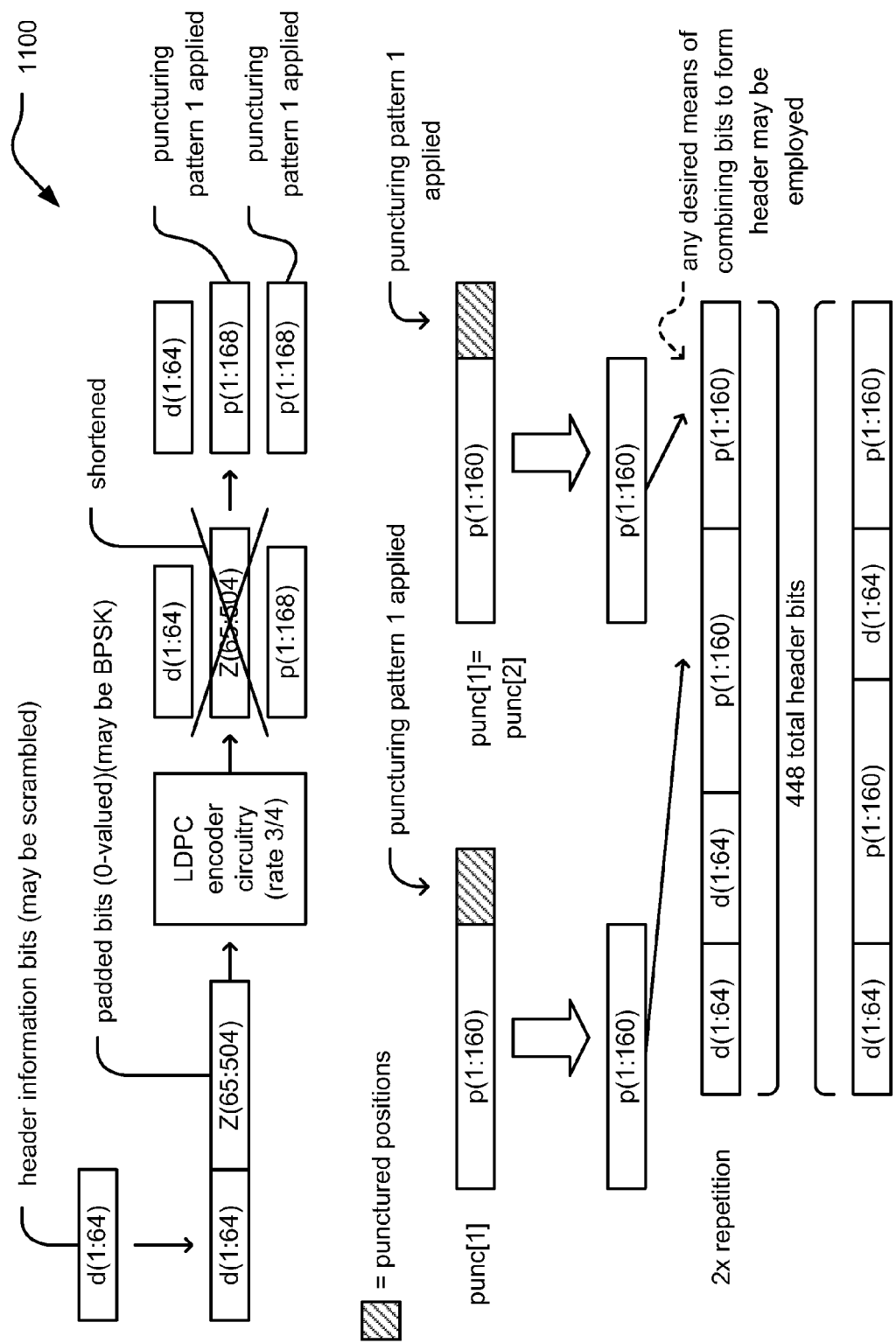
FIG. 11, FIG. 12, and FIG. 13 illustrate various embodiments of an apparatus that is operative to process header information bits thereby generating a header, by employing selective puncturing, in accordance with an effective coding rate of 1/7 for use in a PHY frame to be transmitted in accordance with SC signaling.
Figure 12:
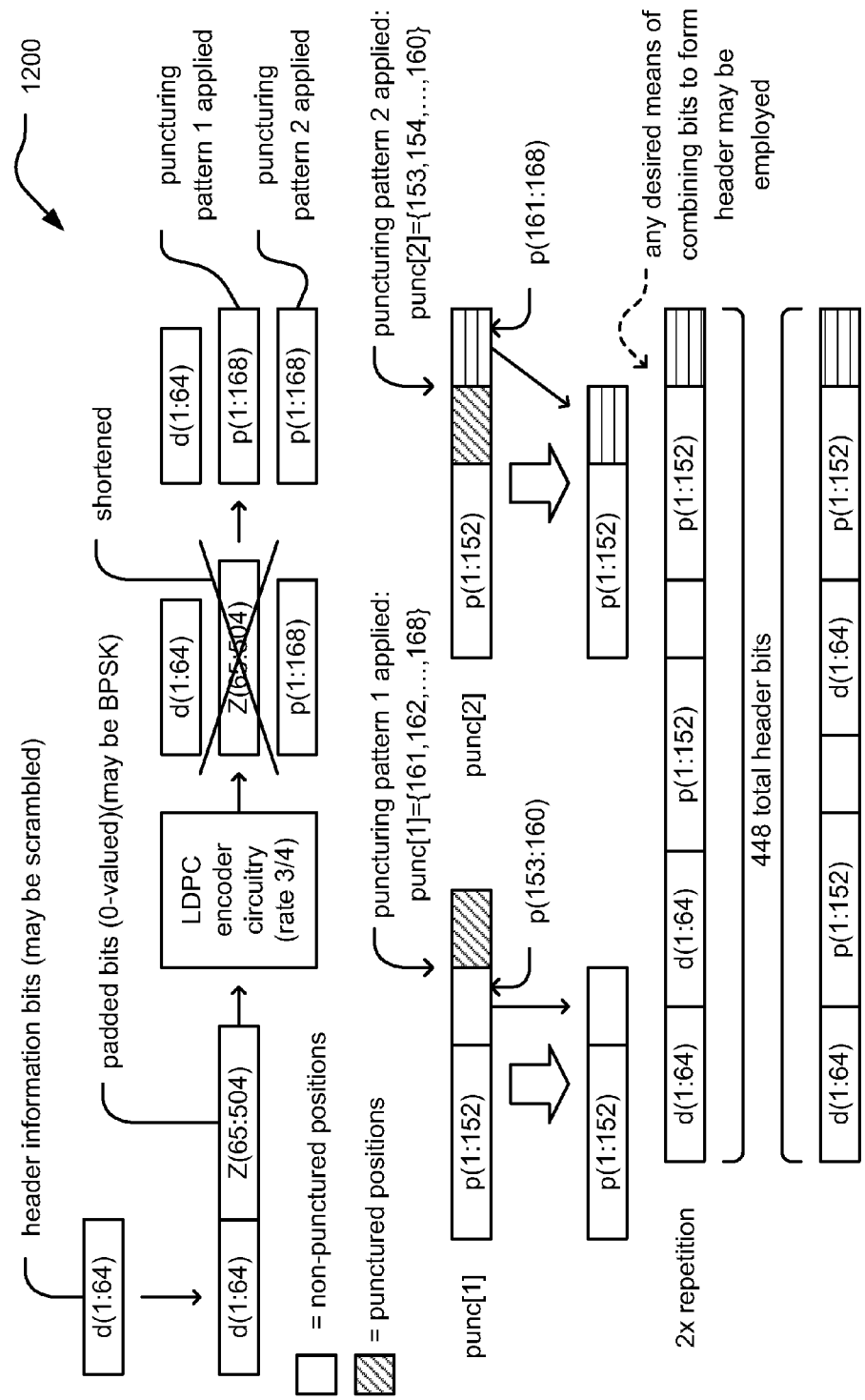
Figure 13:
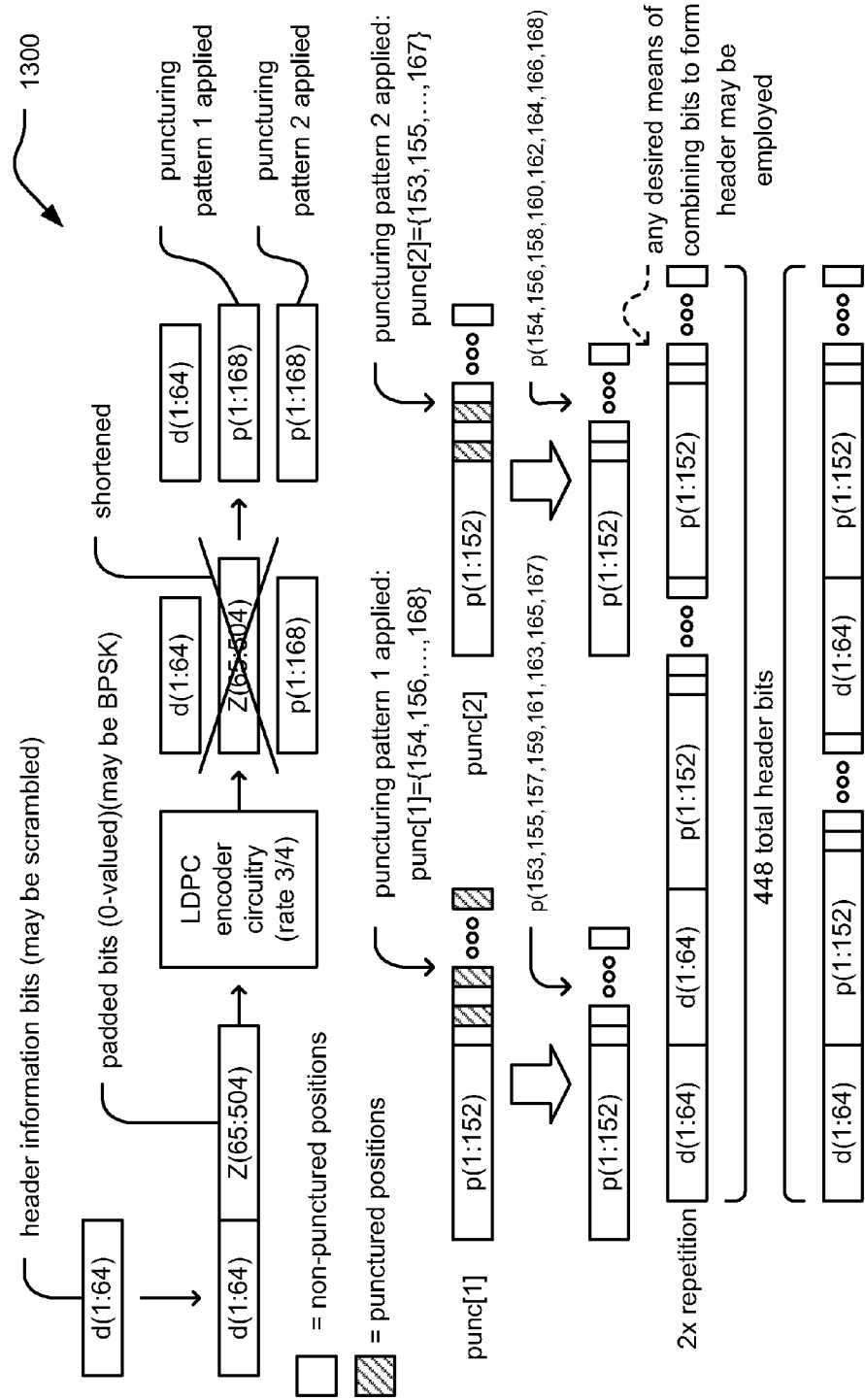

FIG. 11, FIG. 12, and FIG. 13 illustrate various embodiments of an apparatus 1100, 1200, and 1300, respectively, that is operative to process header information bits thereby generating a header, by employing selective puncturing, in accordance with an effective coding rate of 1/7 for use in a PHY frame to be transmitted in accordance with SC signaling.

Referring to embodiment 1100 of FIG. 11, a greater number of header information bits are employed than in certain previous embodiments (e.g., 64 header information bits vs. 56 header information bits). In addition, puncturing of selected bits is performed in this embodiment 1100. A common puncturing pattern is applied to different portions thereof.

This embodiment 1100 may be referred to as SC header encoding example 2 as having an effective rate 1/7, K=64, N=448, (672, 504) LDPC code. As can be seen, a common puncturing pattern, depicted as punc[1]=punc[2]={161, 162, ..., 168}, is applied to the parity/redundancy bits and the duplicate copy generated there from.

In other embodiments, certain of the header information bits themselves may also undergo puncturing (as also presented below in other embodiments). Again, in this embodiment 1100 as well as in any embodiment presented herein, any desired means of combination of the bits may be made to generate the final header.

One embodiment forms the header (e.g., by using a spreader circuitry) by employing the information bits, e.g., d(1), ..., d(64), d(1), ..., d(64), followed by p(1), ..., p(160) and p(1), ..., p(160). However, in an alternative embodiment, the header is generated by employing the information bits, e.g., d(1), ..., d(64) followed by p(1), ..., p(160), then followed by a duplicate of the information bits, d(1), ..., d(64), and then followed by p(1), ..., p(160). Again, any desired means of combination of the bits may be made to generate the final header.

Referring to embodiment 1200 of FIG. 12, a greater number of header information bits are employed than in certain previous embodiments (e.g., 64 header information bits vs. 56 header information bits). In addition, puncturing of selected bits is performed in this embodiment 1200. At least two separate and distinct puncturing patterns are applied to different portions thereof.

This embodiment 1200 may be referred to as SC header encoding example 3 as having an effective rate 1/7, K=64, N=448, (672, 504) LDPC code. As can be seen, two separate and distinct puncturing patterns, depicted as punc[1]={161, 162, ..., 168}, and punc[2]={153, 154, ..., 160}, respectively, are applied to the parity/redundancy bits and the duplicate copy generated there from. After puncturing, the remaining/non-punctured bits are composed of p(153:160) and p(161:168), respectively.

This embodiment 1200 shows the puncturing being performed therein to use consecutive puncturing. For example, a consecutive/contiguous group of bits are punctured.

In other embodiments, certain of the header information bits themselves may also undergo puncturing (as also presented below in other embodiments). Again, in this embodiment as well as in any embodiment presented herein, any desired means of combination of the bits may be made to generate the final header.

One embodiment forms the header (e.g., by using a spreader circuitry) by employing the information bits, e.g., d(1), ..., d(64), d(1), ..., d(64), followed by p(1), ..., p(152), followed by p(153), ..., p(160), and p(1), ..., p(152), followed by p(161), ..., p(168). However, in an alternative embodiment, the header is generated by employing the information bits, e.g., d(1), ..., d(64) followed by p(1), ..., p(152), followed by p(153), ..., p(160), then followed by a duplicate of the information bits, d(1), ..., d(64), and then followed by p(1), ..., p(152), followed by p(161), ..., p(168). Again, any desired means of combination of the bits may be made to generate the final header.

Referring to embodiment 1300 of FIG. 13, a greater number of header information bits are employed than in certain previous embodiments (e.g., 64 header information bits vs. 56 header information bits). In addition, puncturing of selected bits is performed in this embodiment 1200. At least two separate and distinct puncturing patterns are applied to different portions thereof.

This embodiment may be referred to as SC header encoding example 4 as having an effective rate 1/7, K=64, N=448, (672, 504) LDPC code. As can be seen, two separate and distinct puncturing patterns, punc[1]={154, 156, ..., 168}, punc[2]={153, 155, ..., 167}, respectively, are applied to the parity/redundancy bits and the duplicate copy generated there from.

After puncturing, the remaining/non-punctured bits are composed of p(153, 155, 157, 159, 161, 163, 165, 167) and p(154, 156, 158, 160, 162, 164, 166, 168), respectively.

This embodiment 1300 shows the puncturing being performed therein to use non-consecutive puncturing. For example, a non-consecutive/non-contiguous group of bits are punctured. Different non-consecutive/non-contiguous portions of the parity/redundancy bits and the duplicate copy thereof undergo puncturing.

Again, in other embodiments, certain of the header information bits themselves may also undergo puncturing (as also presented below in other embodiments). Also, in this embodiment as well as in any embodiment presented herein, any desired means of combination of the bits may be made to generate the final header.

One embodiment forms the header (e.g., by using a spreader circuitry) by employing the information bits, e.g., d(1), ..., d(64), d(1), ..., d(64), followed by p(1), ..., p(152), followed by p(153, 155, 157, 159, 161, 163, 165, 167), and p(1), ..., p(152), followed by p(154, 156, 158, 160, 162, 164, 166, 168). However, in an alternative embodiment, the header is generated by employing the information bits, e.g., d(1), ..., d(64) followed by p(1), ..., p(152), followed by p(153, 155, 157, 159, 161, 163, 165, 167), then followed by a duplicate of the information bits, d(1), ..., d(64), and then followed by p(1), ..., p(152), followed by p(154, 156, 158, 160, 162, 164, 166, 168). Again, any desired means of combination of the bits may be made to generate the final header.

In accordance with the header encoding presented herein, certain embodiments that perform header encoding (e.g., scrambled and encoded) using a single SCM block may be described as described below. The header will be encoded using a single SCM block of $N_{CBPB}$ symbols with $N_{GI}$ guard symbols. The bits are scrambled and encoded as follows:

(1) The input header bits ($b_1, b_2, \ldots, b_{LH}$), where LH=64, are scrambled, starting from the eighth bit. to create $d_{1s}=(q_1, q_2, \ldots, q_{LH})$ (2) The LDPC codeword $c=(q_1, q_2, \ldots, q_{LH}, 0_1, 0_2, \ldots, 0_{504-LH}, p_1, p_2, \ldots, p_{168})$ is created by concatenating 504-LH zeros to the LH bits of $d_{1s}$ and then generating the parity bits $p_1, p_2, \ldots, p_{168}$ such that $Hc^T=0$, where H is the parity check matrix for the rate 3/4 LDPC code.

(3) Remove bits LH+1 through 504 and bits 665 through 672 of the codeword c to create the sequence $cs1=(q_1, q_2, \ldots, q_{LH}, p_1, p_2, \ldots, p_{160})$.

(4) Remove bits LH+1 through 504 and bits 657 through 664 of the codeword c and then XORed with the one-time pad sequence (starting from left and with the LSB the first to be used in each nibble) to create the sequence $cs2=(q_1, q_2, \ldots, q_{LH}, p_1, p_2, \ldots, p_{152}, p_{161}, p_{162}, \ldots, p_{168})$.

(5) cs1 and cs2 are concatenated to form the sequence (cs1, cs2). The resulting 448 bits are then mapped as π/2−BPSK. The $N_{GI}$ guard symbols are then pre-pended to the resulting $N_{CBPB}$ symbols.

Figure 14:
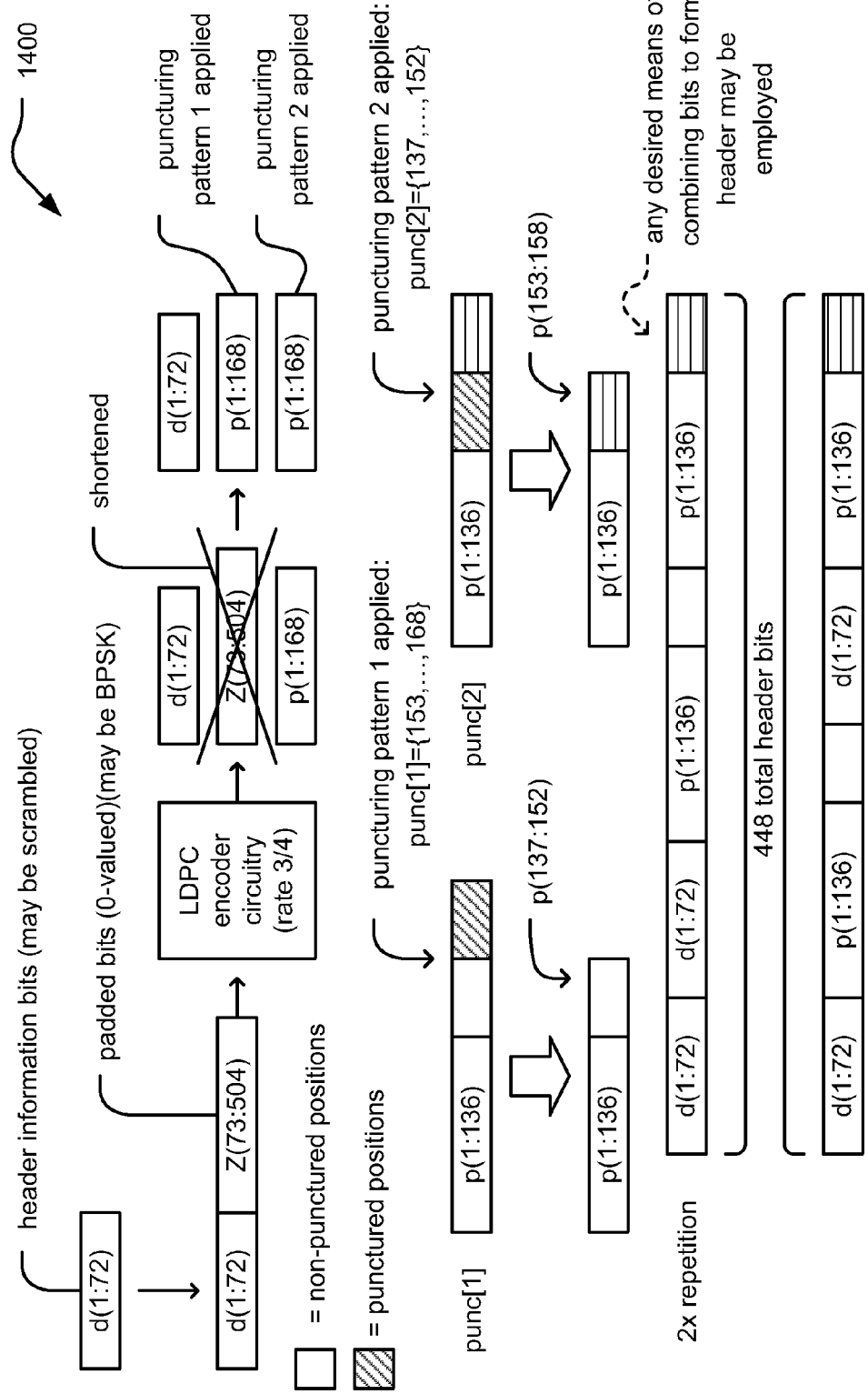
FIG. 14 illustrates an embodiment of an apparatus that is operative to process header information bits thereby generating a header, by employing selective puncturing, in accordance with an effective coding rate of 9/56 for use in a PHY frame to be transmitted in accordance with SC signaling.

FIG. 14 illustrates an embodiment of an apparatus 1400 that is operative to process header information bits thereby generating a header, by employing selective puncturing, in accordance with an effective coding rate of 9/56 for use in a PHY frame to be transmitted in accordance with SC signaling.

In this embodiment 1400, an even greater number of header information bits are employed than in certain previous embodiments (e.g., 72 header information bits vs. 64 header information bits or 56 header information bits). In addition, puncturing of selected bits is performed in this embodiment 1400. At least two separate and distinct puncturing patterns are applied to different portions thereof.

This embodiment may be referred to as SC header encoding example 5 (employing K=72 header information bits) as having an effective rate 9/56, K=72, N=448, (672, 504) LDPC code. As can be seen, two separate and distinct puncturing patterns, punc[1]={153:168}, punc[2]={137:152}, respectively, are applied to the parity/redundancy bits and the duplicate copy generated there from.

After puncturing the 16 positions in each of the parity/redundancy bits and the duplicate copy generated there from, the remaining/non-punctured bits are composed of p(137:152) and p(153:168), respectively.

This embodiment 1400 shows the puncturing being performed therein to use consecutive puncturing. For example, a consecutive/contiguous group of bits are punctured.

In other embodiments, certain of the header information bits themselves may also undergo puncturing (as also presented below in other embodiments). Again, in this embodiment as well as in any embodiment presented herein, any desired means of combination of the bits may be made to generate the final header.

One embodiment forms the header (e.g., by using a spreader circuitry) by employing the information bits, e.g., d(1), . . . , d(72), d(1), . . . , d(72), followed by p(1), . . . , p(136), followed by p(137:152), and p(1), . . . , p(136), followed by p(153:158). However, in an alternative embodiment, the header is generated by employing the information bits, e.g., d(1), . . . , d(64) followed by p(1), . . . , p(136), followed by p(137:152), then followed by a duplicate of the information bits, d(1), . . . , d(64), and then followed by p(1), . . . , p(136), followed by p(153:158). Again, any desired means of combination of the bits may be made to generate the final header.

Oftentimes performance diagrams are described in the context of BLER (Block Error Rate) [or BER (Bit Error Rate)] versus $E_b/N_o$ (ratio of energy per bit $E_b$ to the Spectral Noise Density $N_o$) or SNR (Signal to Noise Ratio). This term $E_b/N_o$ is the measure of SNR for a digital communication system. When looking at such performance curves, the BLER [or BER] may be determined for any given $E_b/N_o$ (or SNR) thereby providing a relatively concise representation of the performance of the decoding approach.

Figure 15:
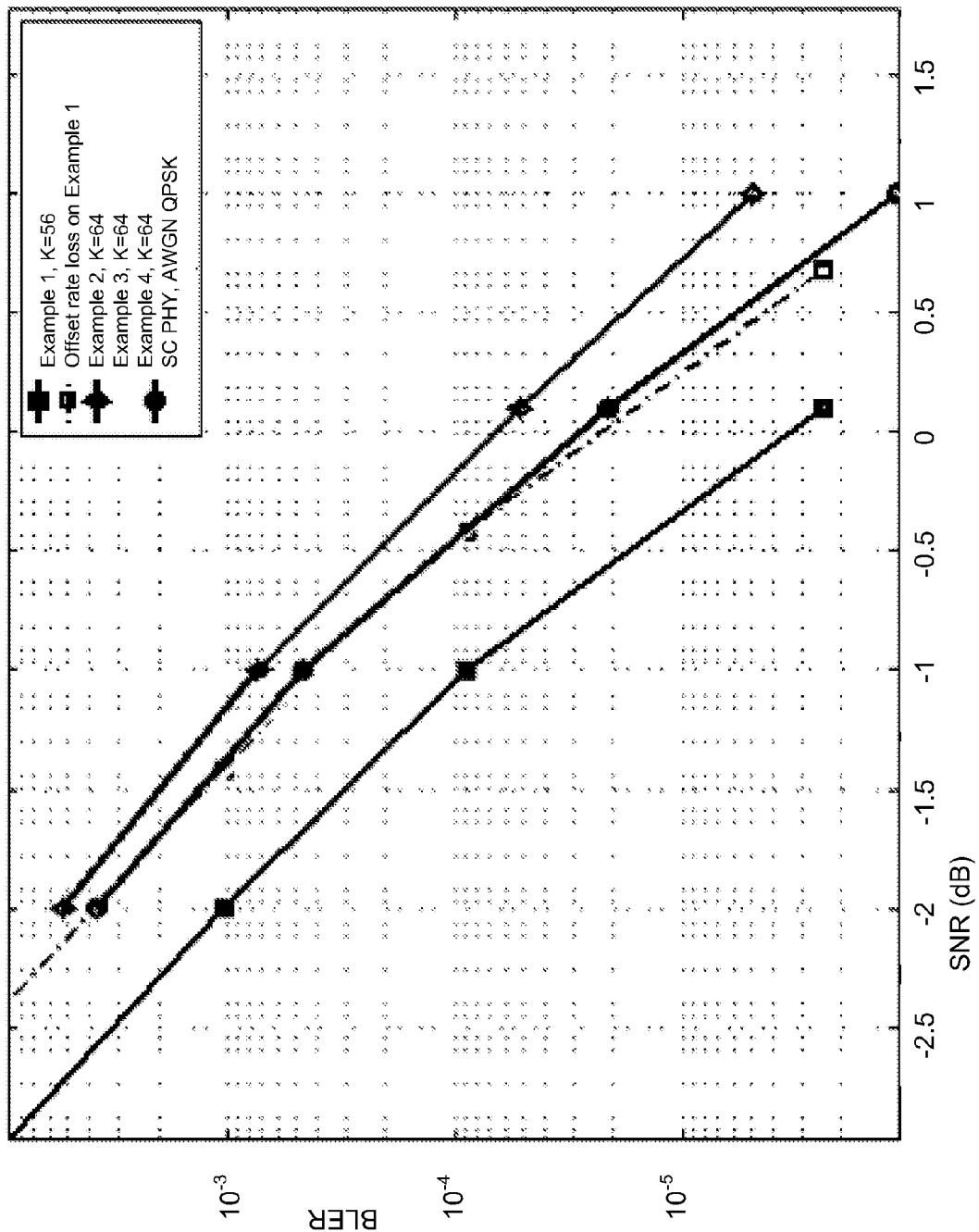
FIG. 15 illustrates an embodiment of performance comparisons of various LDPC codes, each employing a respective header encoding approach, using single carrier (SC) signaling with quadrature phase shift keying (QPSK) modulation on an additive white Gaussian noise (AWGN) communication channel.

FIG. 15 illustrates an embodiment 1500 of performance comparisons of various LDPC codes, each employing a respective header encoding approach, using single carrier (SC) signaling with quadrature phase shift keying (QPSK) modulation on an additive white Gaussian noise (AWGN) communication channel.

The various examples 1, 2, 3, and 4 presented in certain of the previous diagrams are shown in this diagram to show the relative performance thereof based on a AWGN communication channel.

To compensate for the coding offset incurred by the different effective coding rate of 1/8 (corresponding to example 1) when compared to the effective coding rate of 1/7 (corresponding to examples 2, 3, and 4), the performance curve of example 1 is shifted appropriately to allow for an accurate comparison.

Figure 16:
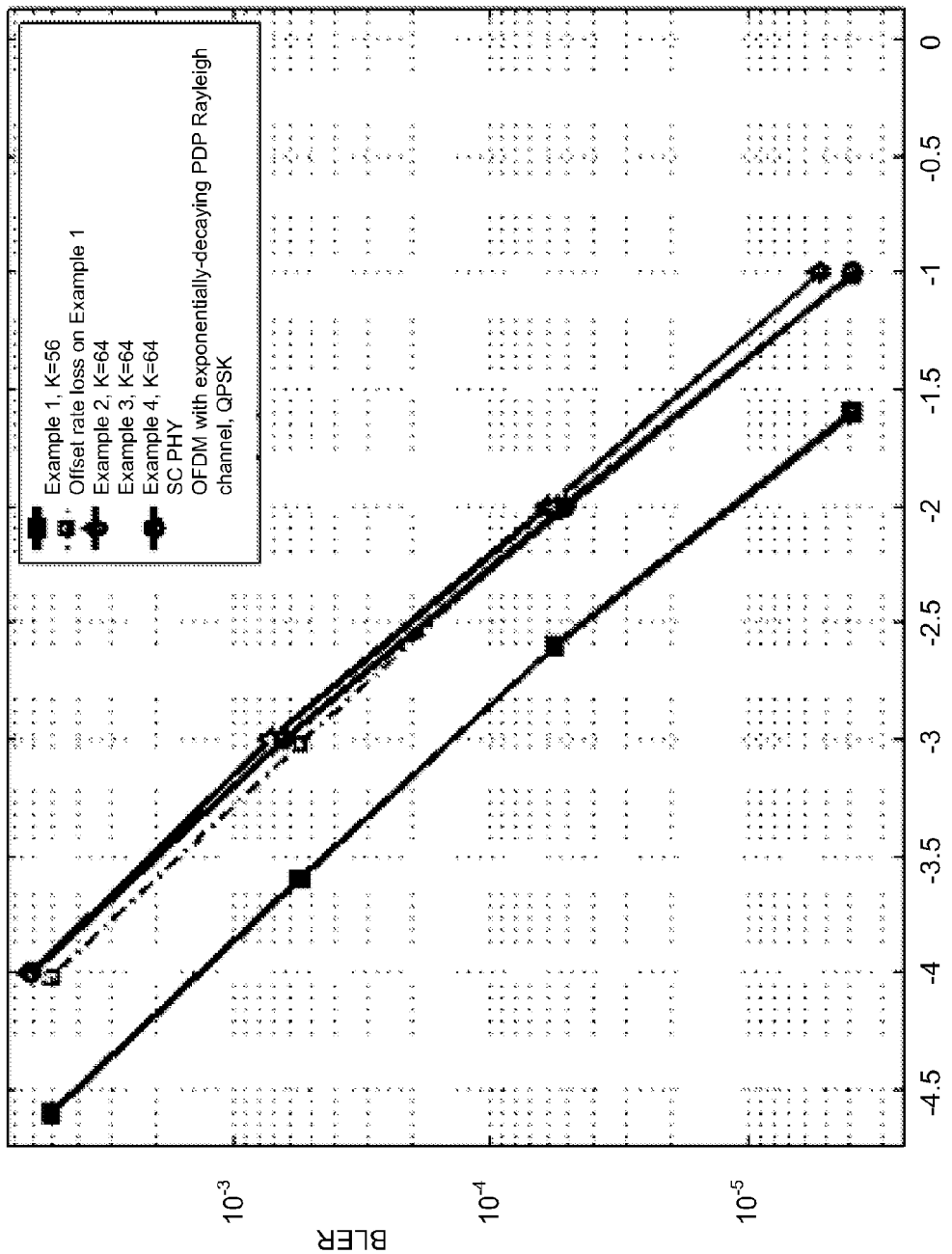
FIG. 16 illustrates an embodiment of performance comparisons of various LDPC codes, each employing a respective header encoding approach, using SC signaling with an exponential decaying power delay profile (PDP) Rayleigh fading communication channel QPSK modulation.

FIG. 16 illustrates an embodiment 1600 of performance comparisons of various LDPC codes, each employing a respective header encoding approach, using SC signaling with an exponential decaying power delay profile (PDP) Rayleigh fading communication channel QPSK modulation.

The various examples 1, 2, 3, and 4 presented in certain of the previous diagrams are shown in this diagram to show the relative performance thereof based on an exponential decaying PDP Rayleigh fading communication channel QPSK modulation.

Again, as with the previous embodiment 1500, to compensate for the coding offset incurred by the different effective coding rate of 1/8 (corresponding to example 1) when compared to the effective coding rate of 1/7 (corresponding to examples 2, 3, and 4), the performance curve of example 1 is shifted appropriately to allow for an accurate comparison.

Performance Analysis for SC Header

A net coding gain or loss may be incurred when considering the rate loss of 1/8 comparing to 1/7. However, the net coding gain or loss of the effective rate 1/8 codes is of course offset by approximately 10 log 10 ((1/7)/(1/8))=0.58 dB (e.g., see doted curves in the performance diagrams as referenced above).

In comparing to the effective rate 1/8 code (e.g., example 1) and the effective rate 1/7 codes (e.g., examples 2, 3, and 4) on an AWGN channel, the following observations may be made. Example 3 and 4 have no net performance loss. Example 2 has net 0.25 dB performance loss. An absolute (not counting rate gain) SNR loss of Example 3 and 4 is 0.58 dB.

In comparing to the effective rate 1/8 code (e.g., example 1) and the effective rate 1/7 codes (e.g., examples 2, 3, and 4) on OFDM with exponentially-decaying PDP Rayleigh channel, the following observations may be made. Examples 2, 3 and 4 all have no net performance loss. An absolute (not counting rate gain) SNR loss of Examples 2, 3 and 4 is 0.58 dB.

OFDM Header Encoding Scheme

Figure 17:
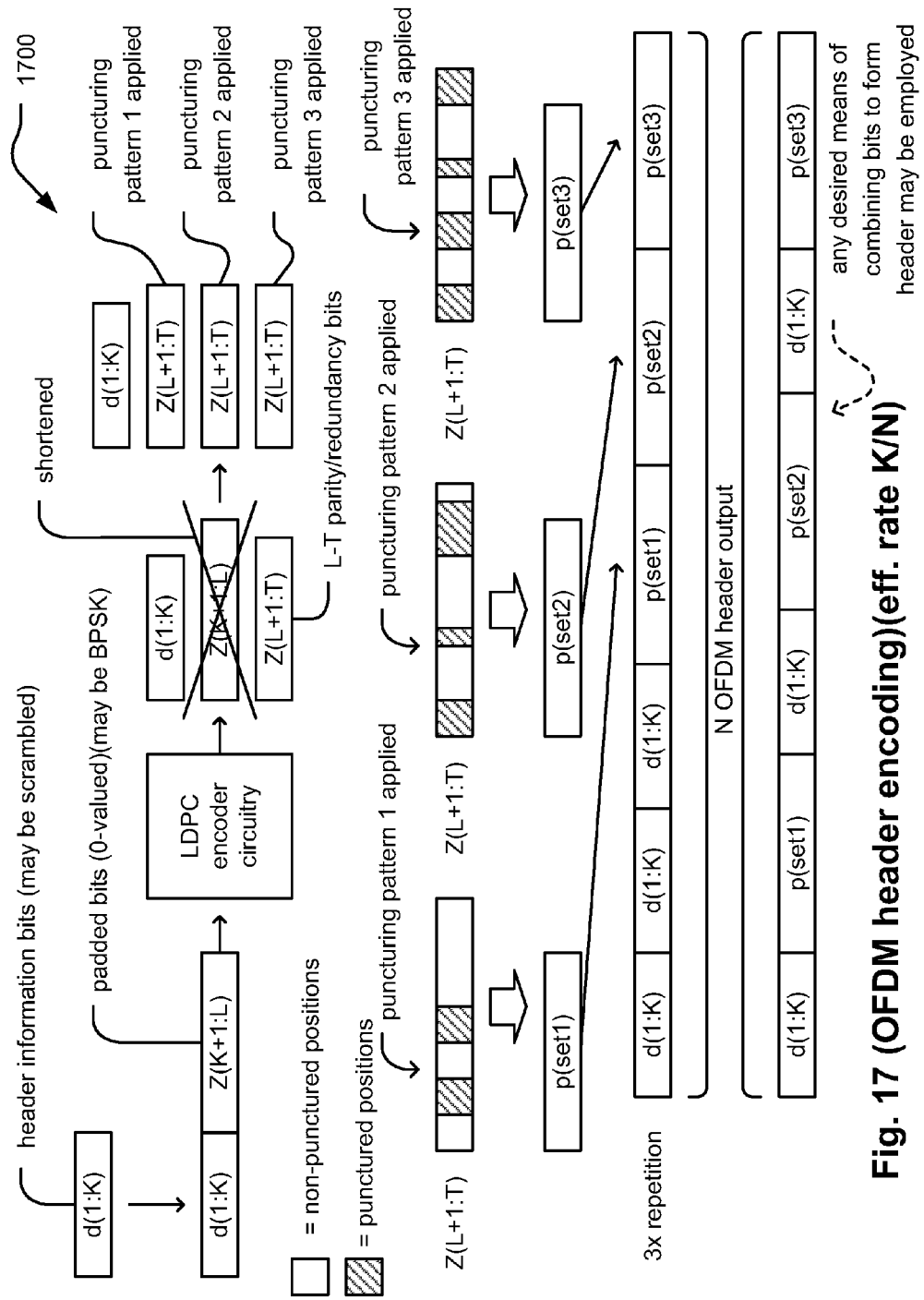
FIG. 17 illustrates an embodiment of an apparatus that is operative to process header information bits thereby generating a header, by employing selective puncturing, in accordance with an effective coding rate of K/N (K and N integers) for use in a PHY frame to be transmitted in accordance with OFDM signaling.

FIG. 17 illustrates an embodiment 1700 of an apparatus that is operative to process header information bits thereby generating a header, by employing selective puncturing, in accordance with an effective coding rate of K/N (K and N integers) for use in a PHY frame to be transmitted in accordance with OFDM signaling.

Again, when more header information bits are employed (e.g., those bits that include the information that are operative to make a frame self-describing), and when a fixed output size of the eventually generated header is desirable while still employing the same base LDPC code, then selective puncturing may also be performed in accordance with the header encoding technique to the header encoding scheme. This selective puncturing may employ multiple puncturing patterns as applied to various portions of a group of bits. For example, the selective puncturing may be applied to parity/redundancy bits, to copies/duplicated portions of those parity/redundancy bits (as may be generated in accordance with repetition/spreading), to the original header information bits themselves, and/or to copies/duplicated portions of those information bits themselves.

In accordance with OFDM signaling, certain operational parameters may be defined including: output size of OFDM header encoding, say N; rate R (L,T) LDPC code, say LDPC (R), where L is the block size and T is the size of information bits.

The K header information bits (where K≦T) may undergo scrambling thereby generating d(1), . . . , d(K) that then undergo padding.

The K header information bits (where K≦T) may undergo scrambling thereby generating the bits d(1), . . . , d(K) that then undergo padding. After padding T−K 0 bits thereto (e.g., shown as z(K+1), . . . , z(T) 0-valued bits that are padded after the K information bits (shortening)), then these K header information bits and the padded bits are provided to an LDPC encoder circuitry. Of course, it is noted that zero-valued bits (e.g., padded bits) are not transmitted via the communication channel (e.g., on the air in a wireless communication channel embodiment).

The LDPC encoder circuitry is operative to encode d(1), . . . , d(K), z(K+1), . . . , z(T) using an LDPC code, LDPC(R), to get L-T parity/redundancy bits, shown as p(1), . . . , p(L-T).

With respect to OFDM, more than two separate and distinct puncturing patterns are employed. Instead three separate and distinct puncturing patterns are employed, depicted as punc

[1], punc[2], and punc[3], respectively, on L-T parity bits, respectively, to get two three sub-sequences of un-punctured parity bits, say p(set1)={p($i_1$), p($i_2$), . . . , p($i_a$)}, p(set2)={p($j_1$), p($j_2$), . . . , p($j_b$)}, and p(set2)=p($k_1$), p($k_2$), . . . , p($k_c$) such that 3×K+a+b+c=N.

It is noted that punc[1] is a subset of {1, . . . , L-T} of size L-T-a, punc[2] is a subset of {1, . . . , L-T} of size L-T-b and punc[3] is a subset of {1, . . . , L-T} of size L-T-c. The output duplicated information bits, e.g., d(1), . . . , d(K), d(1), . . . , d(K), are followed by p(set1), p(set2) and p(set3). The effective code rate of such a header encoding approach is K/N.

While this embodiment shows an example of combining the bits to generate the header by employing the information bits, e.g., d(1), . . . , d(K), d(1), . . . , d(K), are followed by p(set1) and p(set2), as described above, with respect to any embodiment of the SC PHY header and OFDM PHY header presented herein.

While this embodiment shows an example of combining the bits (e.g., using a spreading circuitry) to generate the header by employing the information bits, e.g., d(1), . . . , d(K), d(1), . . . , d(K), d(1), . . . , d(K), are followed by p(set1), p(set2), and p(set3), as described above, with respect to any embodiment of the SC PHY header and OFDM PHY header presented herein. In an alternative embodiment, the header is generated by employing the information bits, e.g., d(1), . . . , d(K) followed by p(set1), followed by a duplicate of the information bits, d(1), . . . , d(K), and then followed by p(set2), followed by a duplicate of the information bits, d(1), . . . , d(K), and then followed by p(set3).

It is again noted that any desired means of combination of the bits may be made to generate the final header (e.g., rearranging of the bits in accordance with scrambling, interleaving, etc. including switching the order of any two or more bits; the order in which the header information bits, the remaining/non-punctured bits [whether they be header information bits or parity/redundancy bits] may be emplaced in the final formed header in accordance with any desired manner or order as a particular embodiment or implementation would prefer or require. For example, while many of the embodiments presented herein, the header information bits (which are repeated) are followed by the parity/redundancy bits (which are also repeated). However, the order in which these bits are included to form the final header may also be changed without departing from the scope and spirit of the invention (e.g., parity/redundancy bits firstly followed by the header information bits; alternatively: header information bits followed by parity/redundancy bits then followed by a copy/duplicate of the header information bits then followed by a copy/duplicate of the parity/redundancy bits).

Figure 18:
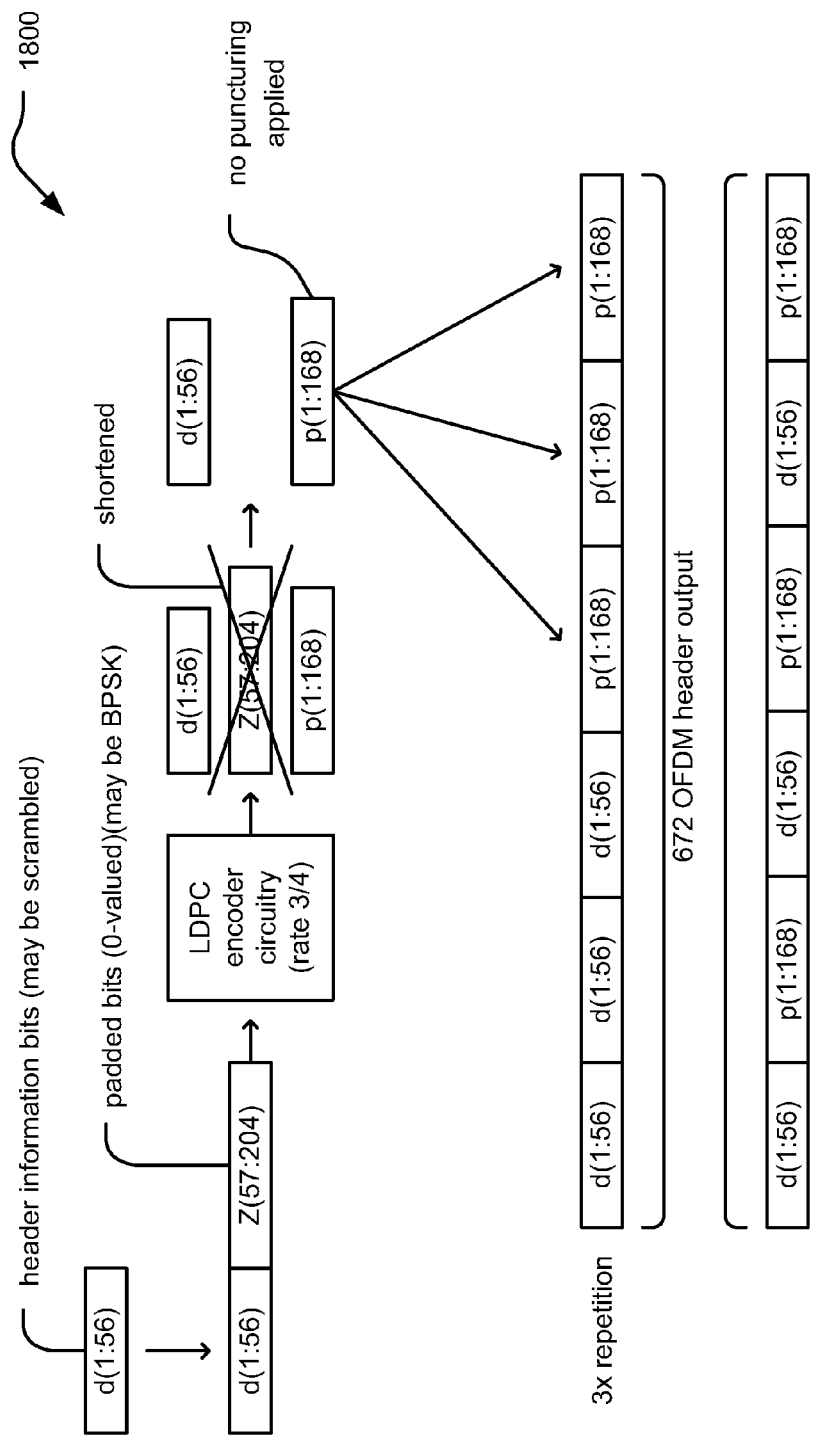
FIG. 18 illustrates an embodiment of an apparatus that is operative to process header information bits thereby generating a header in accordance with an effective coding rate of 1/12 for use in a PHY frame to be transmitted in accordance with OFDM signaling.

FIG. 18 illustrates an embodiment of an apparatus 1800 that is operative to process header information bits thereby generating a header in accordance with an effective coding rate of 1/12 for use in a PHY frame to be transmitted in accordance with OFDM signaling.

This embodiment employs no puncturing therein, and consequently no selective puncturing therein that applied different puncturing patterns to different portions of the block. This embodiment may be referred to as OFDM header encoding example 1 as having an effective rate 1/12, K=56, N=672, (672, 504) LDPC code. Again, no puncturing is performed I this embodiment, i.e. punc[1]=punc[2]=punc[3]=Ø.

One embodiment forms the header (e.g., by using a spreader circuitry) by employing the information bits, e.g., d(1), . . . , d(56), d(1), . . . , d(56), d(1), . . . , d(56), followed by p(1), . . . , p(168), p(1), . . . , p(168), and p(1), . . . , p(168). However, in an alternative embodiment, the header is generated by employing the information bits, e.g., d(1), . . . , d(56) followed by p(1), . . . , p(168), then followed by a duplicate of the information bits, d(1), . . . , d(56), and then followed by p(1), . . . , p(168), and then followed by a duplicate of the information bits, d(1), . . . , d(56), and then followed by p(1), . . . , p(168). Again, any desired means of combination of the bits may be made to generate the final header.

Figure 19:
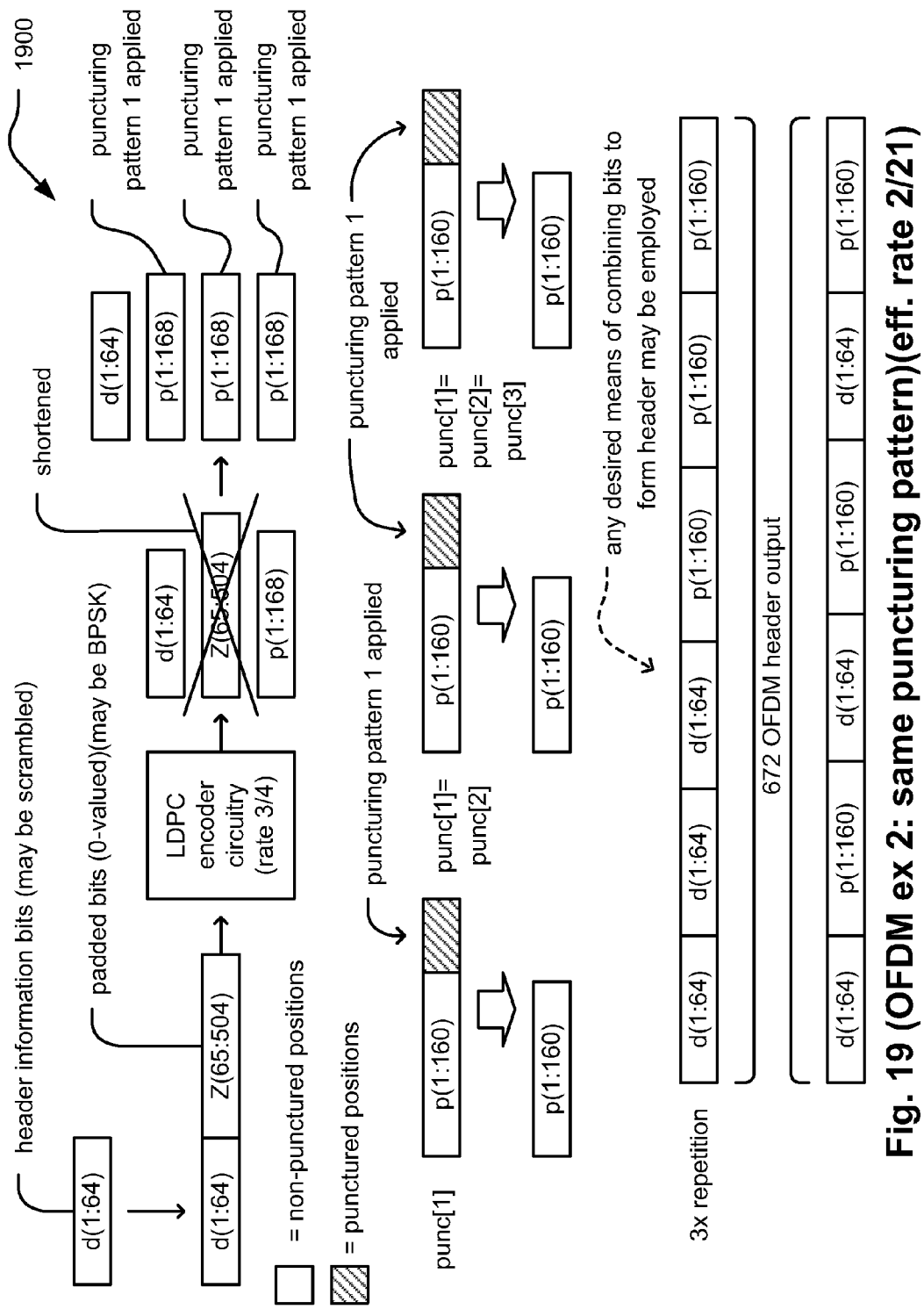
FIG. 19, FIG. 20 and FIG. 21 illustrate various embodiments of an apparatus that is operative to process header information bits thereby generating a header, by employing selective puncturing, in accordance with an effective coding rate of 2/21 for use in a PHY frame to be transmitted in accordance with OFDM signaling.
Figure 20:
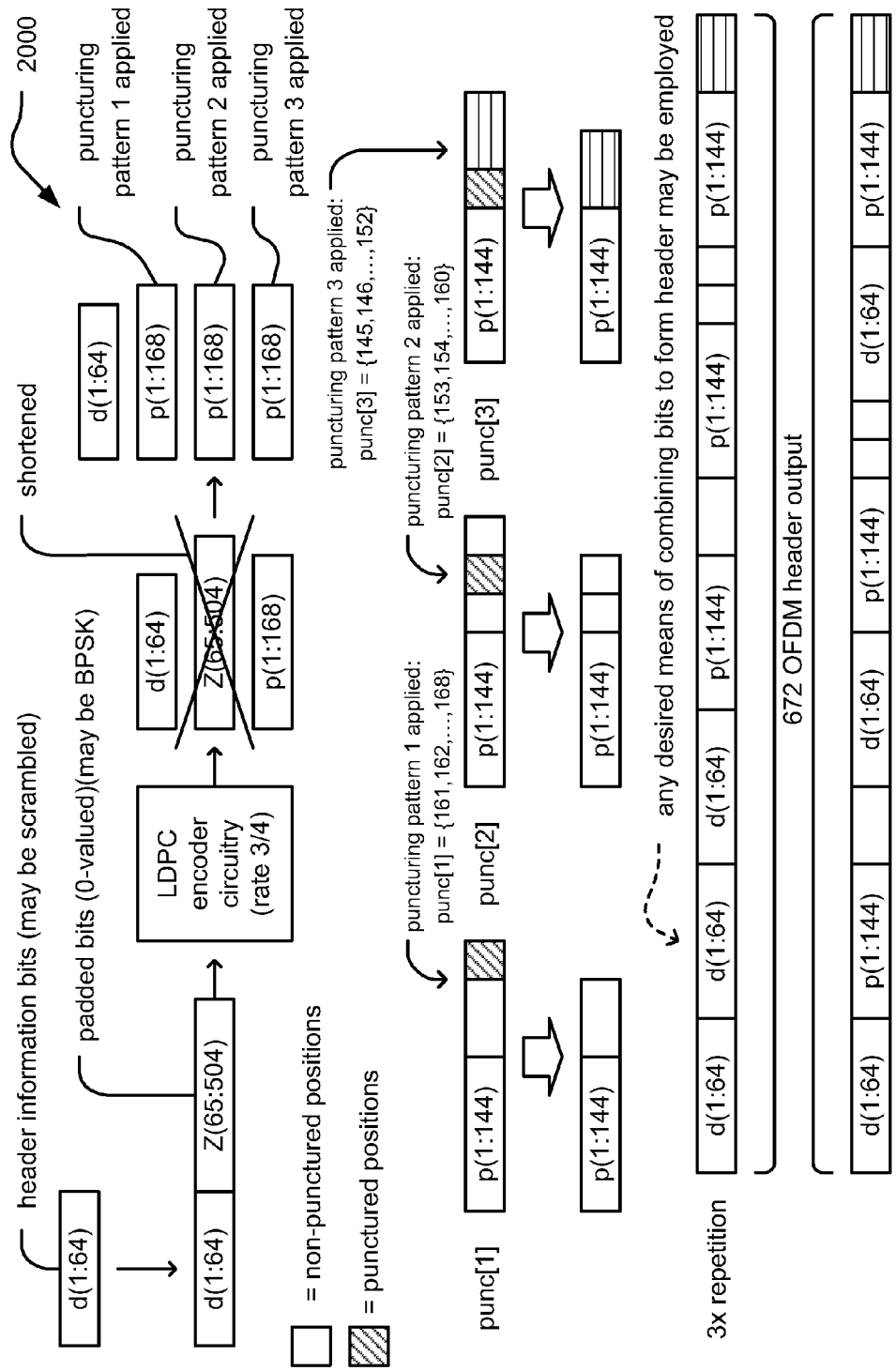
Figure 21:
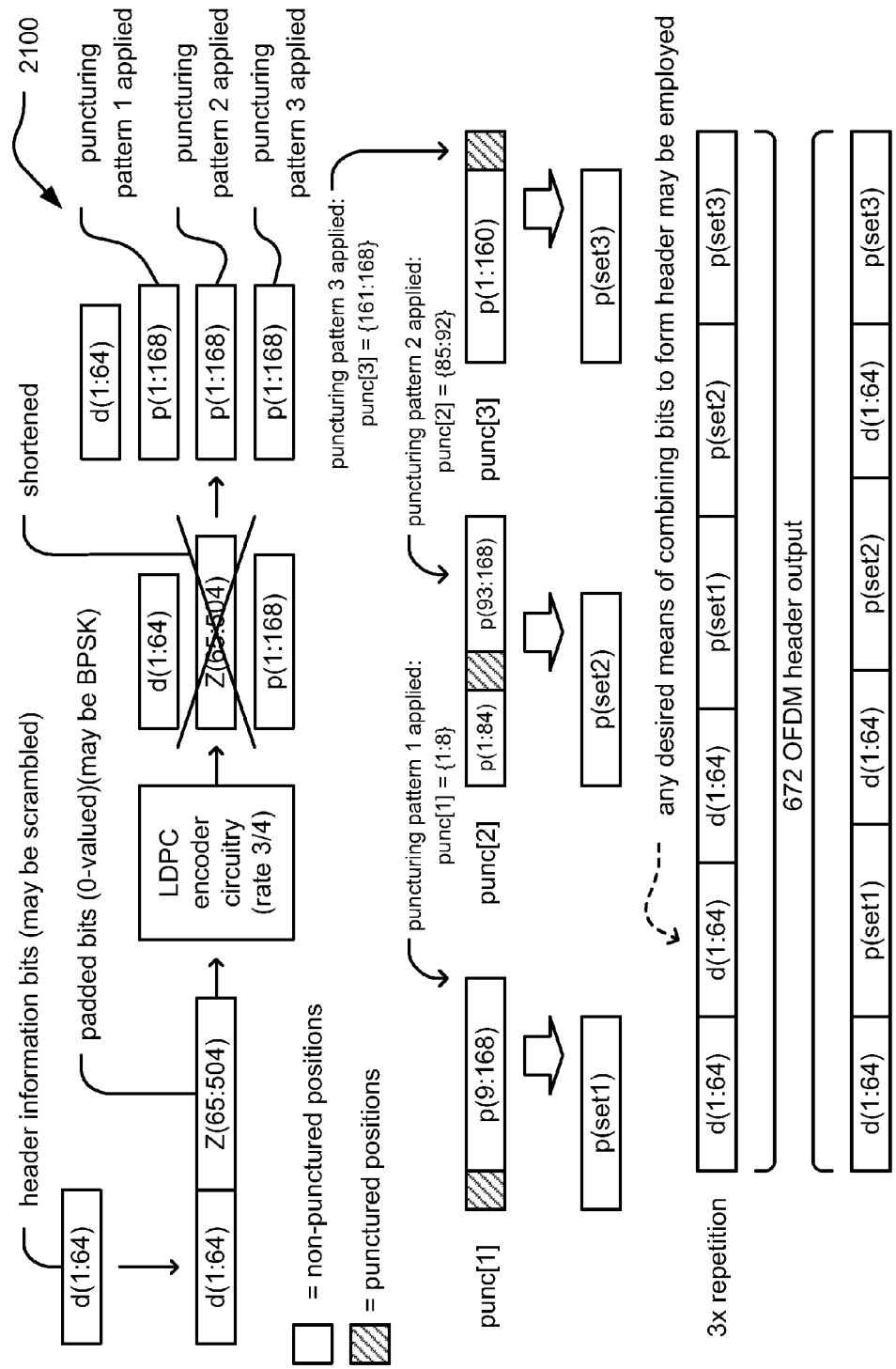

FIG. 19, FIG. 20 and FIG. 21 illustrate various embodiments of an apparatus 1900, 2000, and 2100, respectively, that is operative to process header information bits thereby generating a header, by employing selective puncturing, in accordance with an effective coding rate of 2/21 for use in a PHY frame to be transmitted in accordance with OFDM signaling.

Referring to embodiment 1900 of FIG. 19, a greater number of header information bits are employed than in certain previous embodiments (e.g., 64 header information bits vs. 56 header information bits). In addition, puncturing of selected bits is performed in this embodiment 1900. A common puncturing pattern is applied to different portions thereof.

This embodiment may be referred to as OFDM header encoding example 2 as having an effective rate 2/21, K=64, N=672, (672, 504) LDPC code. As can be seen, a common puncturing pattern, depicted as punc[1]=punc[2]=punc[3]={161, 162, . . . , 168}, is applied to the parity/redundancy bits and the duplicate two separate copies generated there from.

In other embodiments, certain of the header information bits themselves may also undergo puncturing (as also presented below in other embodiments). Again, in this embodiment 1900 as well as in any embodiment presented herein, any desired means of combination of the bits may be made to generate the final header.

One embodiment forms the header (e.g., by using a spreader circuitry) by employing the information bits, e.g., d(1), . . . , d(64), d(1), . . . , d(64), and d(1), . . . , d(64), followed by p(1), . . . , p(160), p(1), . . . , p(160), and p(1), . . . , p(160). However, in an alternative embodiment, the header is generated by employing the information bits, e.g., d(1), . . . , d(64) followed by p(1), . . . , p(160), then followed by a duplicate of the information bits, d(1), . . . , d(64), and then followed by p(1), . . . , p(160), and then followed by a duplicate of the information bits, d(1), . . . , d(64), and then followed by p(1), . . . , p(160). Again, any desired means of combination of the bits may be made to generate the final header.

Referring to embodiment 2000 of FIG. 20, a greater number of header information bits are employed than in certain previous embodiments (e.g., 64 header information bits vs. 56 header information bits). In addition, puncturing of selected bits is performed in this embodiment 2000. At least two separate and distinct puncturing patterns are applied to different portions thereof.

This embodiment 1200 may be referred to as OFDM header encoding example 3 as having an effective rate 2/21, K=64, N=672, (672, 504) LDPC code. As can be seen, three separate and distinct puncturing patterns, depicted as punc[1]={161, 162, . . . , 168}, punc[2]={153, 154, . . . , 160}, and punc[3]={145, 146, . . . , 152}, respectively, are applied to the parity/redundancy bits and the duplicate copies generated there from. After puncturing, the remaining/non-punctured bits are composed of p(145:160), p(145:152) U p(161:168), p(153:168), respectively.

This embodiment 2000 shows the puncturing being performed therein to use consecutive puncturing. For example, a consecutive/contiguous group of bits are punctured. Different consecutive/contiguous portions of the parity/redundancy bits and the duplicate copies thereof undergo puncturing.

Again, in other embodiments, certain of the header information bits themselves may also undergo puncturing (as also presented below in other embodiments). Also, in this embodiment as well as in any embodiment presented herein, any desired means of combination of the bits may be made to generate the final header.

One embodiment forms the header (e.g., by using a spreader circuitry) by employing the information bits, e.g., d(1), . . . , d(64), d(1), . . . , d(64), and d(1), . . . , d(64), followed by p(1), . . . , p(144), followed by p(145:160), then followed by p(1), . . . , p(144), which is followed by p(145:152) U p(161:168), and then followed by p(1), . . . , p(144) which is followed by p(153:168). However, in an alternative embodiment, the header is generated by employing the information bits, e.g., d(1), . . . , d(64) followed by p(1), . . . , p(144), followed by p(145:160), then followed by a duplicate of the information bits, d(1), . . . , d(64), and then followed by p(1), . . . , p(144), which is followed by p(145:152) U p(161:168), and then followed by a duplicate of the information bits, p(1), . . . , p(144) which is followed by p(153:168). Again, any desired means of combination of the bits may be made to generate the final header.

Referring to embodiment 2100 of FIG. 21, a greater number of header information bits are employed than in certain previous embodiments (e.g., 64 header information bits vs. 56 header information bits). In addition, puncturing of selected bits is performed in this embodiment 2100. At least three separate and distinct puncturing patterns are applied to different portions thereof.

This embodiment may be referred to as OFDM header encoding example 4 as having an effective rate 2/21, K=64, N=672, (672, 504) LDPC code. As can be seen, three separate and distinct puncturing patterns, depicted as punc[1]=(1:8), punc[2]=(85:92), and punc[3]=(161:168), respectively, are applied to the parity/redundancy bits and the duplicate copies generated there from. After puncturing, the remaining/non-punctured bits are composed of p(set1)=p(9:168), p(set2)=p(1:84) U p(93:168), and p(set3)=p(1:160), respectively.

This embodiment 2100 shows the puncturing being performed therein to use consecutive puncturing. For example, a consecutive/contiguous group of bits are punctured. Different consecutive/contiguous portions of the parity/redundancy bits and the duplicate copies thereof undergo puncturing.

Again, in other embodiments, certain of the header information bits themselves may also undergo puncturing (as also presented below in other embodiments). Also, in this embodiment as well as in any embodiment presented herein, any desired means of combination of the bits may be made to generate the final header.

While this embodiment shows an example of combining the bits (e.g., using a spreading circuitry) to generate the header by employing the information bits, e.g., d(1), . . . , d(64), d(1), . . . , d(64), d(1), . . . , d(64), are followed by p(set1), p(set2), and p(set3), as described above, with respect to any embodiment of the SC PHY header and OFDM PHY header presented herein. In an alternative embodiment, the header is generated by employing the information bits, e.g., d(1), . . . , d(64) followed by p(set1), followed by a duplicate of the information bits, d(1), . . . , d(64), and then followed by p(set2), followed by a duplicate of the information bits, d(1), . . . , d(64), and then followed by p(set3).

In accordance with the header encoding presented herein, certain embodiments that perform header encoding (e.g., scrambled and encoded) using a single OFDM symbol may be described as follows:

(1) The 64 header bits ($b_1, b_2, \ldots, b_{LH}$), where LH=64, are scrambled, starting from the eighth bit, to create $q=(q_1, q_2, \ldots, q_{LH})$ (2) The sequence q is padded with 440 zeros to obtain a total of 504 bits, ($q_1, q_2, \ldots, q_{LH}, 0_{LH+1}, 0_{LH+2}, \ldots 0_{504}$), which are then encoded using the rate—3/4 LDPC code. 168 parity bits, $p_1, p_2, \ldots, p_{168}$, are generated.

(3) A sequence $c_1$ is generated as ($q_1, q_2, \ldots, q_{LH}, p_9, p_{10}, \ldots p_{168}$).

(4) A sequence $c_2$ is generated as ($q_1, q_2, \ldots, q_{LH}, p_1, p_2, \ldots p_{84}, p_{93}, p_{94}, \ldots p_{168}$) XORed with the one-time pad sequence (starting from left and with the LSB the first to be used in each nibble).

(5) A sequence $c_3$ is generated as ($q_1, q_2, \ldots, q_{LH}, p_1, p_2, \ldots p_{160}$) XORed with the one-time pad sequence [which may be different than the one above] (starting from left and with the LSB the first to be used in each nibble).

(6) The sequences $c_1, c_2$ and $c_3$ are concatenated to form the 672-bit sequence $d=(d_1, d_2, d_3, \ldots, d_{672})=(c_1, c_2, c_3)$.

(7) The 672-bit sequence, d, is then mapped as QPSK in accordance with a particular mapping of the constellation points therein, pilots (e.g., pilot symbols) are inserted and the resulting sequence is modulated as an OFDM symbol.

Figure 22:
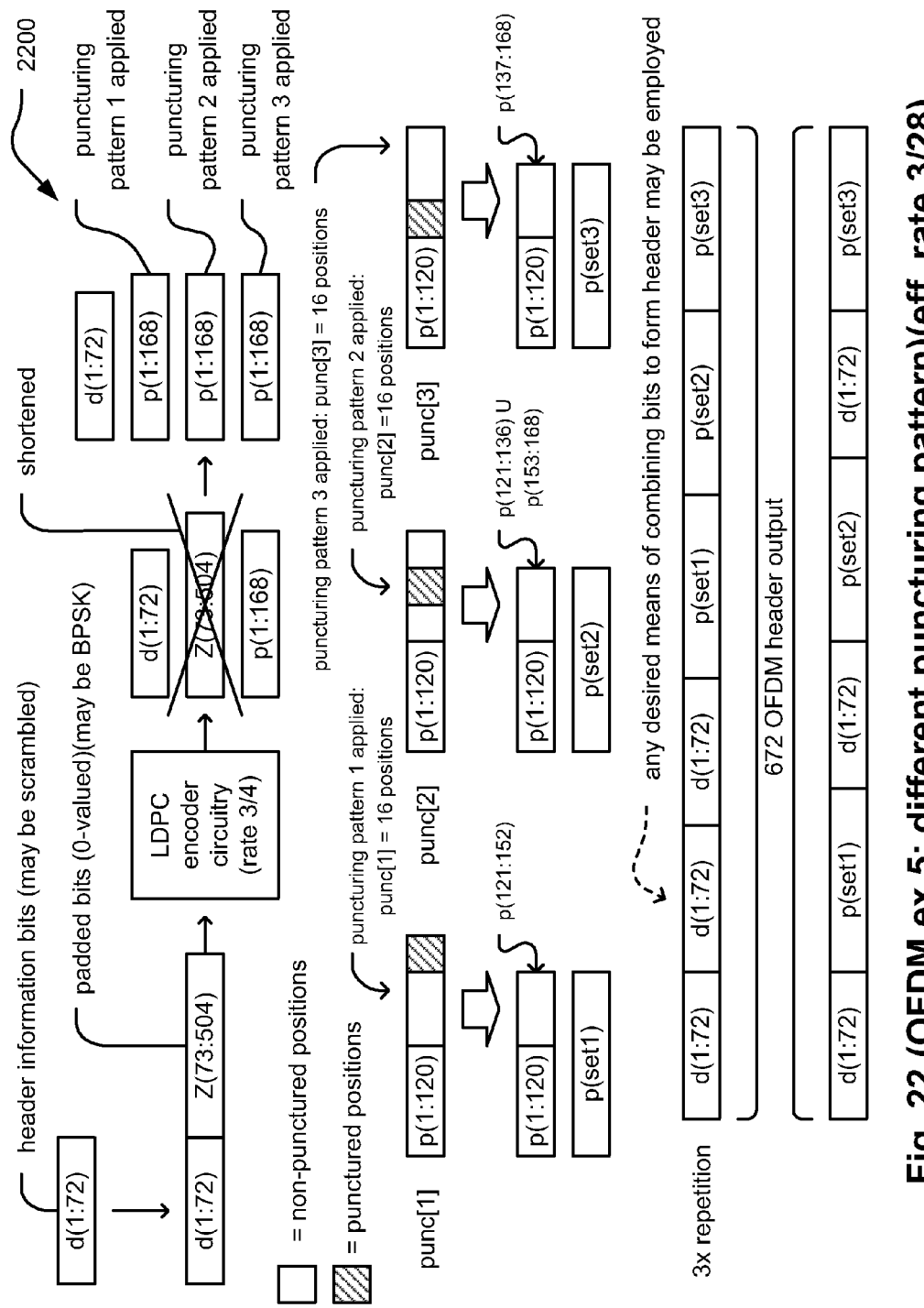
FIG. 22 illustrates an embodiment of an apparatus that is operative to process header information bits thereby generating a header, by employing selective puncturing, in accordance with an effective coding rate of 3/28 for use in a PHY frame to be transmitted in accordance with OFDM signaling.

FIG. 22 illustrates an embodiment of an apparatus 2200 that is operative to process header information bits thereby generating a header, by employing selective puncturing, in accordance with an effective coding rate of 3/28 for use in a PHY frame to be transmitted in accordance with OFDM signaling.

Referring to embodiment 2200 of FIG. 22, an even greater number of header information bits are employed than in certain previous embodiments (e.g., 72 header information bits vs. 64 header information bits or 56 header information bits). In addition, puncturing of selected bits is performed in this embodiment 2200. At least three separate and distinct puncturing patterns are applied to different portions thereof.

This embodiment may be referred to as OFDM header encoding example 5 operating on an even greater number of header information bits (e.g., K=72) and as having an effective rate 3/28, K=72, N=672, (672, 504) LDPC code. As can be seen, three separate and distinct puncturing patterns, each puncturing 16 positions, respectively, are applied to the parity/redundancy bits and the duplicate copies generated there from. After puncturing, the remaining/non-punctured bits are composed of p(121:152), p(121:136) U p(153:168), and p(137:168), respectively.

This embodiment 2200 shows the puncturing being performed therein to use consecutive puncturing. For example, a consecutive/contiguous group of bits are punctured. Different consecutive/contiguous portions of the parity/redundancy bits and the duplicate copies thereof undergo puncturing.

Again, in other embodiments, certain of the header information bits themselves may also undergo puncturing (as also presented below in other embodiments). Also, in this embodiment as well as in any embodiment presented herein, any desired means of combination of the bits may be made to generate the final header.

While this embodiment shows an example of combining the bits (e.g., using a spreading circuitry) to generate the header by employing the information bits, e.g., d(1), . . . , d(72), d(1), . . . , d(72), d(1), . . . , d(72), are followed by p(set1), p(set2), and p(set3), as described above, with respect to any embodiment of the SC PHY header and OFDM PHY header presented herein. In an alternative embodiment, the header is generated by employing the information bits, e.g., d(1), . . . , d(72) followed by p(set1), followed by a duplicate of the information bits, d(1), . . . , d(72), and then followed by p(set2), followed by a duplicate of the information bits, d(1), . . . , d(72), and then followed by p(set3).

Figure 23:
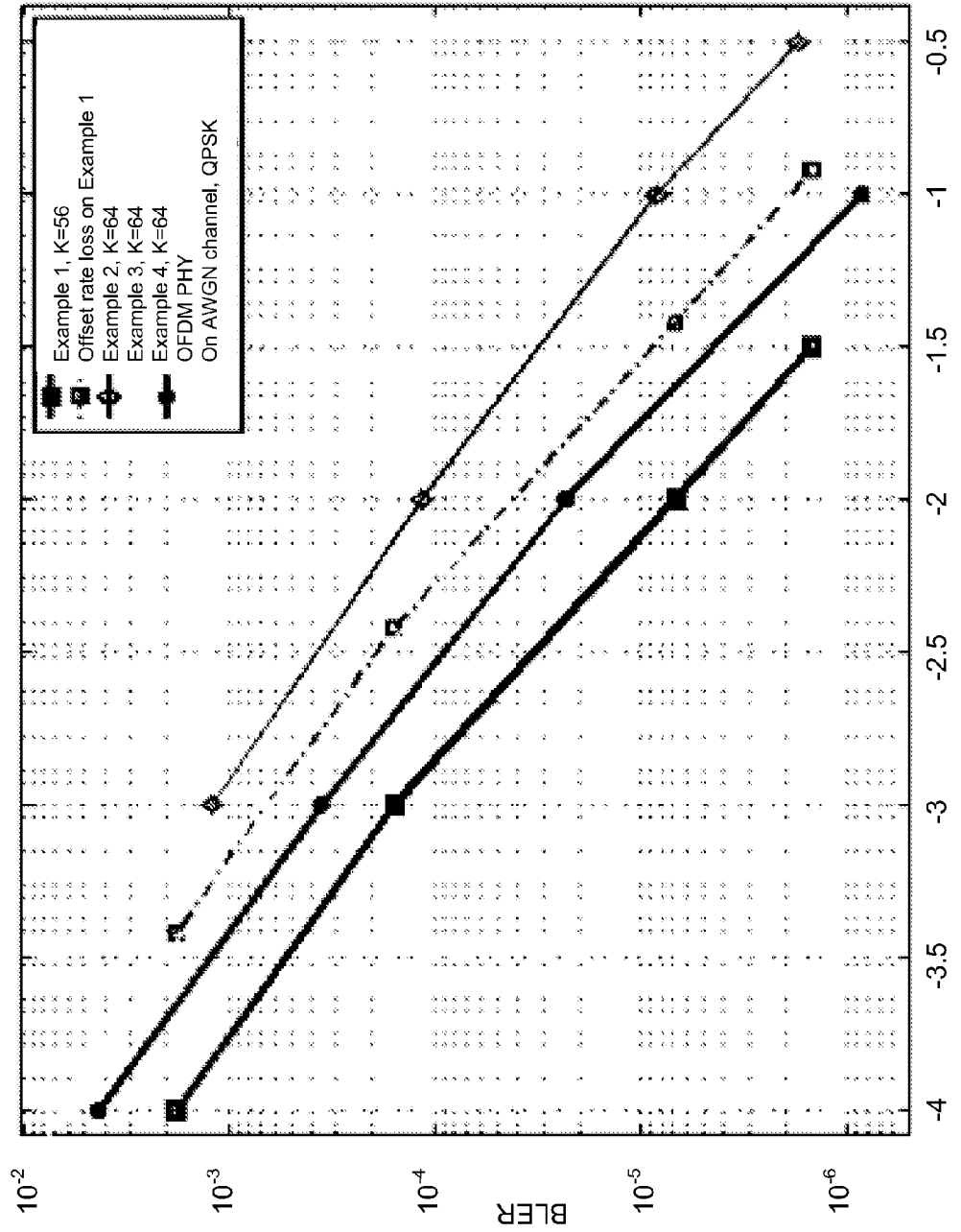
FIG. 23 illustrates an embodiment of performance comparisons of various LDPC codes, each employing a respective header encoding approach, using OFDM signaling with quadrature phase shift keying (QPSK) modulation on an AWGN communication channel.

FIG. 23 illustrates an embodiment 2300 of performance comparisons of various LDPC codes, each employing a respective header encoding approach, using OFDM signaling with quadrature phase shift keying (QPSK) modulation on an AWGN communication channel.

The various examples 1, 2, 3, and 4 presented in certain of the previous diagrams are shown in this diagram to show the relative performance thereof based on a AWGN communication channel.

To compensate for the coding offset incurred by the different effective coding rate of 1/12 (corresponding to example 1) when compared to the effective coding rate of 2/21 (corresponding to examples 2, 3, and 4), the performance curve of example 1 is shifted appropriately to allow for an accurate comparison.

Figure 24:
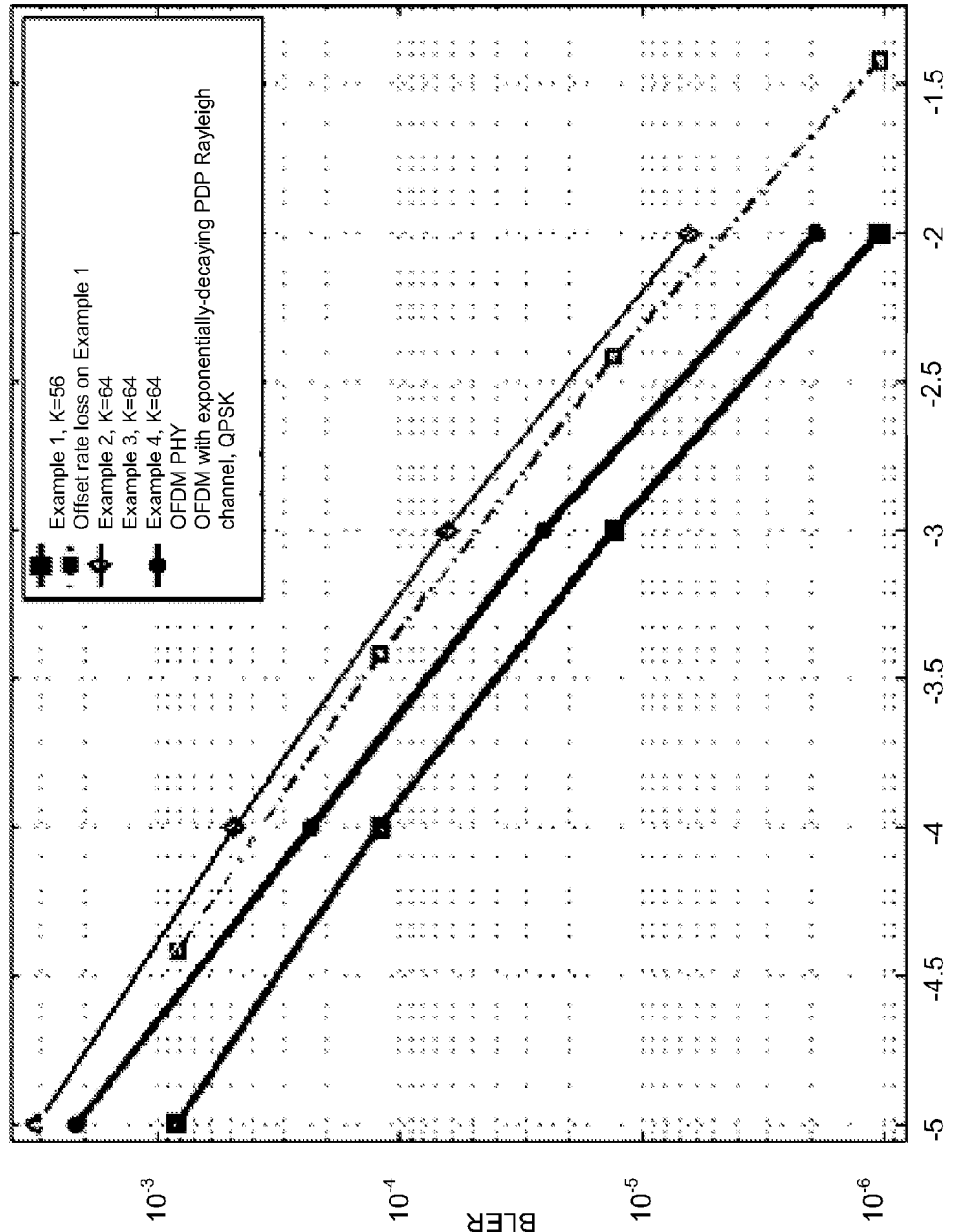
FIG. 24 illustrates an embodiment of performance comparisons of various LDPC codes, each employing a respective header encoding approach, using OFDM signaling with an exponential decaying PDP Rayleigh fading communication channel QPSK modulation.

FIG. 24 illustrates an embodiment 2400 of performance comparisons of various LDPC codes, each employing a respective header encoding approach, using OFDM signaling with an exponential decaying PDP Rayleigh fading communication channel QPSK modulation.

Performance Analysis for OFDM Header

A net coding gain or loss may be incurred when considering rate loss of 1/12 comparing to 2/21. However, the net coding gain or loss of the effective rate 1/12 codes is of course should offset by approximately 10 log 10((2/21)/(1/12)) =0.58 dB (e.g., see doted curves in the performance diagrams as referenced above).

In comparing to the effective rate 1/12 code (e.g., example 1) and the effective rate 2/21 codes (e.g., examples 2, 3, and 4) on an AWGN channel, the following observations may be made. Example 3 has no net performance loss. Example 4 has net 0.25 dB performance gain. An absolute (not counting rate gain) SNR loss of Example 4 is 0.25 dB.

In comparing to the effective rate 1/12 code (e.g., example 1) and the effective rate 2/21 codes (e.g., examples 2, 3, and 4) on OFDM with exponentially-decaying PDP Rayleigh channel, the following observations may be made. Example 3 has 0.12 dB net performance gain. Example 4 has net 0.25 dB performance gain. An absolute (not counting rate gain) SNR loss of Example 4 is 0.25 dB.

Figure 25:
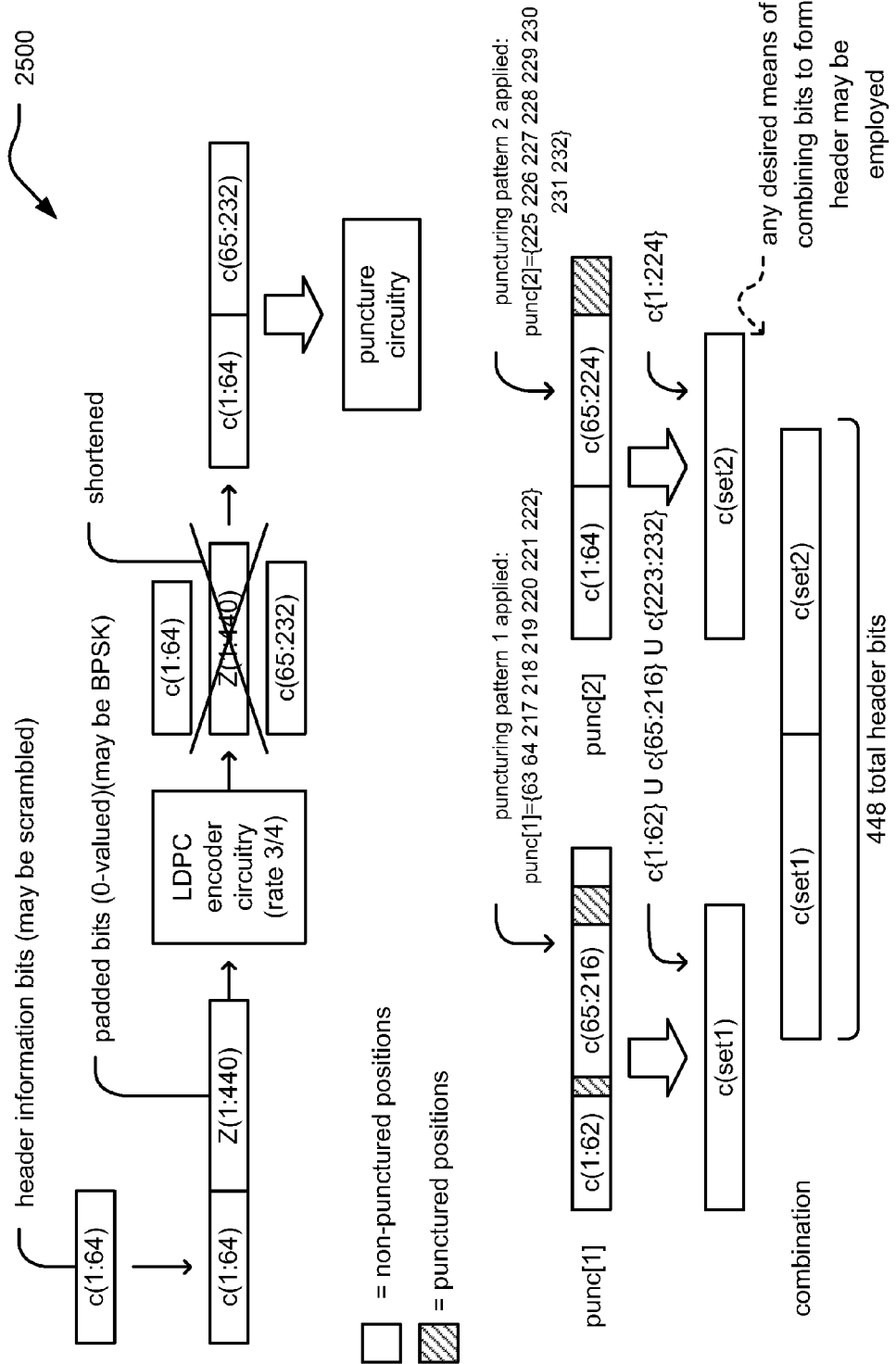
FIG. 25 illustrates an embodiment of an apparatus that is operative to process header information bits thereby generating a header, by employing selective puncturing including puncturing information bits in addition to parity/redundancy bits, in accordance with an effective coding rate of K/N (K and N integers) for use in a PHY frame to be transmitted in accordance with SC signaling.

FIG. 25 illustrates an embodiment of 2500 an apparatus that is operative to process header information bits thereby generating a header, by employing selective puncturing including puncturing information bits in addition to parity/redundancy bits, in accordance with an effective coding rate of K/N (K and N integers) for use in a PHY frame to be transmitted in accordance with SC signaling.

A General Header Encoding (Including Selective Puncturing of Information Bits)

These embodiments show how not only may parity/redundancy bits be selectively punctured, but the header information bits themselves (e.g., those bits that include the information that makes the frame self-describing) may be selectively punctured. As shown in other embodiments herein where two or more puncturing patterns may be applied to the parity/redundancy bits and any duplicate copies generate there from, similarly two or more puncturing patterns may be applied to the header information bits and any duplicate copies generate there from.

In accordance with SC signaling, certain operational parameters may be defined including: output size of the header encoding, say N; rate R (L, T) LDPC code, say LDPC (R), where L is the block size and T is the size of information bits.

The K header information bits (where $K \leq T$) may undergo scrambling thereby generating to get $c(1), \ldots, c(K)$ that then undergo padding. After padding T−K 0 bits thereto (e.g., shown as $z(1), \ldots, z(T-K)$ 0-valued bits that are padded after the K information bits (shortening)), then these K header information bits and the padded bits are provided to an LDPC encoder circuitry. Of course, it is noted that zero-valued bits (e.g., padded bits) are not transmitted via the communication channel (e.g., on the air in a wireless communication channel embodiment).

The LDPC encoder circuitry is operative to encode $c(1), \ldots, c(K), z(1), \ldots, z(T-K)$ using an LDPC code, LDPC(R), to get the output bits that includes parity/redundancy bits, shown as $c(1), c(2), \ldots, c(K), c(K+1), \ldots, c(K+L-T)$.

Thereafter, M separate and distinct puncturing patterns, depicted as punc[1], punc[2], ..., punc[M], respectively, are applied on the K+L-T c bits, respectively, to get the following sub-sequences: $c(set1)=c(i_1), c(i_2), \ldots, c(i_{a1})$; $c(set2)=c(j_1), c(j_2), \ldots, c(j_{a2})$; ...; $c(setM)=c(k_1), c(k_2), \ldots, c(k_{aM})$, respectively, such that a1+a2+ ... +aM=N.

The output sets of bits, c(set1), c(set2), ..., c(setM), are output in any preferred order. The effective code rate of such a header encoding approach is K/N.

This embodiment may be referred to as SC header encoding example 6 as having an effective rate 1/7, K=64, N=448, (672, 504) LDPC code.

As can be seen, two separate and distinct puncturing patterns, punc[1]={63 64 217 218 219 220 221 222}, and punc[2]={225 226 227 228 229 230 231 232}, respectively, are applied to the various bits output from the LDPC encoder circuitry (including the header information bits output there from) and the duplicate copy generated there from.

After puncturing, the remaining/non-punctured bits are composed of c(set1)=c(1:62) U c(65:216) U c(223:232) and c(set2)=c(1:224), respectively.

This embodiment 2500 shows the puncturing being performed therein to use non-consecutive/non-contiguous puncturing. For example, a non-consecutive/non-contiguous group of bits are punctured. Different non-consecutive/non-contiguous portions of the various bits output from the LDPC encoder circuitry (including the header information bits output there from) and the duplicate copies thereof undergo puncturing.

In this embodiment, certain of the header information bits themselves have undergo puncturing. Also, in this embodiment as well as in any embodiment presented herein, any desired means of combination of the bits may be made to generate the final header.

While this embodiment shows an example of combining the bits to generate the header by employing the first set c(set1) followed by the c(set2), as described above, with respect to any embodiment of the SC PHY header and OFDM PHY header presented herein, it is again noted that any desired means of combination of the bits may be made to generate the final header (e.g., rearranging of the bits in accordance with scrambling, interleaving, etc. including switching the order of any two or more bits; the order in which the header information bits, the remaining/non-punctured bits [whether they be header information bits or parity/redundancy bits] may be emplaced in the final formed header in accordance with any desired manner or order as a particular embodiment or implementation would prefer or require. For example, while many of the embodiments presented herein, the header information bits (which are repeated) are followed by the parity/redundancy bits (which are also repeated). However, the order in which these bits are included to form the final header may also be changed without departing from the scope and spirit of the invention (e.g., parity/redundancy bits firstly followed by the header information bits; alternatively: header information bits followed by parity/redundancy bits then followed by a copy/duplicate of the header information bits then followed by a copy/duplicate of the parity/redundancy bits).

Figure 26:
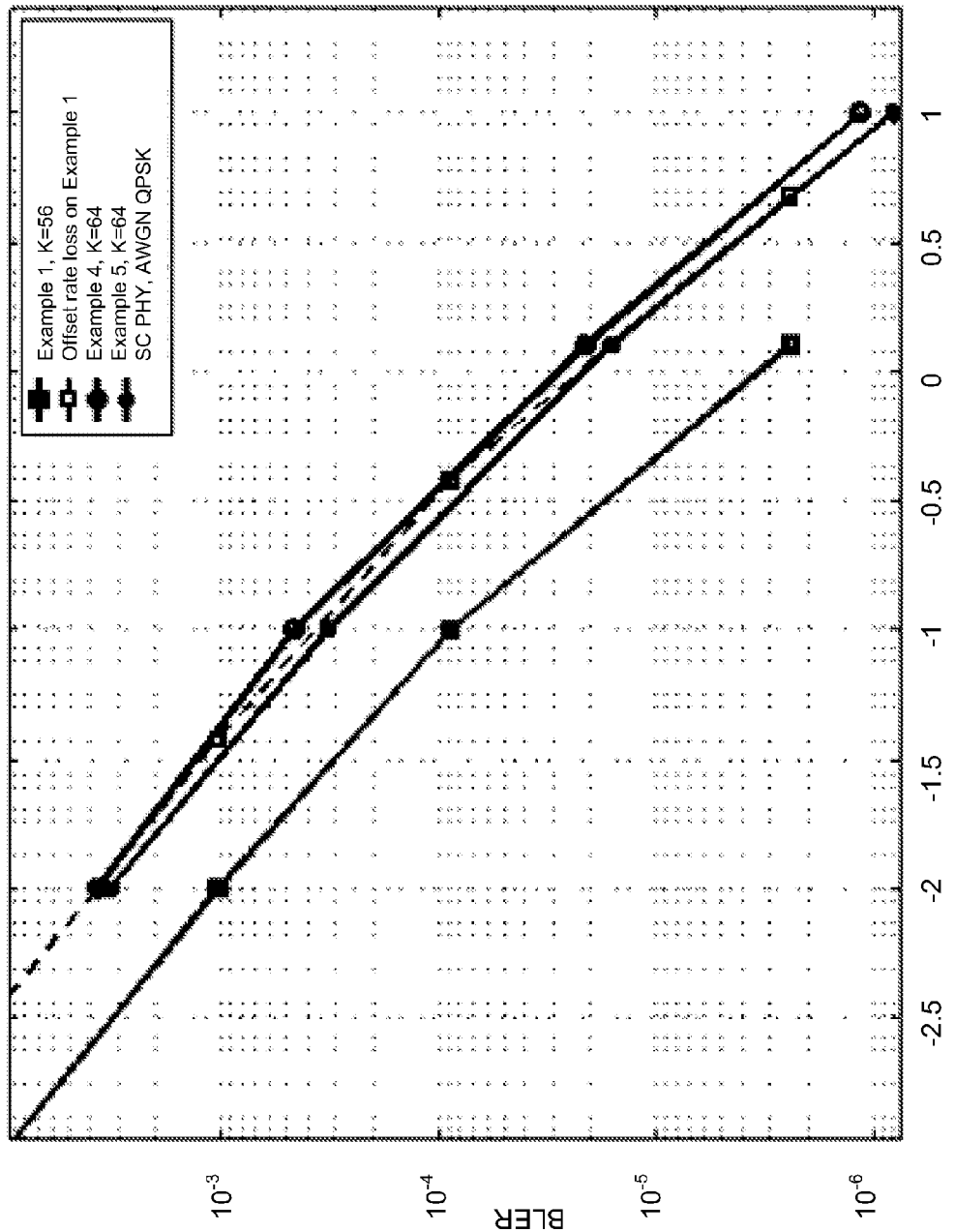
FIG. 26 illustrates an embodiment of performance comparisons of various LDPC codes, each employing a respective header encoding approach, using SC signaling with QPSK modulation on an AWGN communication channel.

FIG. 26 illustrates an embodiment 2600 of performance comparisons of various LDPC codes, each employing a respective header encoding approach, using SC signaling with QPSK modulation on an AWGN communication channel.

The various examples 1, 4, and 5 presented in certain of the previous diagrams are shown in this diagram to show the relative performance thereof based on a AWGN communication channel.

To compensate for the coding offset incurred by the different effective coding rates, the performance curve of example 1 is shifted appropriately to allow for an accurate comparison.

FIG. 27 illustrates an embodiment 2700 of performance comparisons of various LDPC codes, each employing a respective header encoding approach, using SC signaling with an exponential decaying PDP Rayleigh fading communication channel QPSK modulation.

The various examples 1, 4, and 5 presented in certain of the previous diagrams are shown in this diagram to show the relative performance thereof based on an exponential decaying PDP Rayleigh fading communication channel QPSK modulation.

Again, as with the previous embodiment 2600, to compensate for the coding offset incurred by the different effective coding rates, the performance curve of example 1 is shifted appropriately to allow for an accurate comparison.

FIG. 28A illustrates an embodiment of a method 2800 for processing header information bits thereby generating a header.

Referring to method 2800 of FIG. 28A, the method 2800 begins by scrambling header information bits thereby generating scrambled header information bits, as shown in a block 2810. The method 2800 continues by padding at least one bit (e.g., 0-valued bits) to the scrambled header information bits thereby generating padded bit block, as shown in a block 2820.

The method 2800 then operates by encoding padded bit block thereby generating coded bits, as shown in a block 2830. The method 2800 continues by shortening coded bits (e.g., removing padded bits) thereby generating shortened coded bits, as shown in a block 2840. The method 2800 then operates by puncturing at least one bit from the shortened coded bits thereby generating punctured bits, as shown in a block 2850.

The method 2800 continues by spreading (e.g., combining, repeating, etc.) the punctured bits thereby generating header, as shown in a block 2860. The method 2800 then operates by emplacing header within frame, as shown in a block 2870.

FIG. 28B illustrates an embodiment of an alternatively method 2800 for processing header information bits thereby generating a header.

Referring to method 2801 of FIG. 28B, the method 2801 begins by duplicating at least one portion of coded bits (or shortened coded bits) (e.g., parity/redundancy bits of LDPC codeword) thereby generating duplicated bits, as shown in a block 2811. The method 2801 then operates by puncturing, in accordance with a first puncturing pattern, at least one bit from the shortened coded bits thereby generating first punctured bits, as shown in a block 2821.

The method 2801 continues by puncturing, in accordance with a second puncturing pattern, at least one bit from the shortened coded bits thereby generating second punctured bits, as shown in a block 2831. The method 2801 then operates by spreading (e.g., combining, repeating, etc.) the first punctured bits and the second punctured bits thereby generating header, as shown in a block 2841. The method 2800 then operates by emplacing header within frame, as shown in a block 2851.

It is noted that the various modules (e.g., encoding modules, decoding modules, header encoding modules, etc.) described herein may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The operational instructions may be stored in a memory. The memory may be a single memory device or a plurality of memory devices. Such a memory device may be a read-only memory (ROM), random access memory (RAM), volatile memory, non-volatile memory, static memory, dynamic memory, flash memory, and/or any device that stores digital information. It is also noted that when the processing module implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry. In such an embodiment, a memory stores, and a processing module coupled thereto executes, operational instructions corresponding to at least some of the steps and/or functions illustrated and/or described herein.

The present invention has also been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claimed invention.

The present invention has been described above with the aid of functional building blocks illustrating the performance of certain significant functions. The boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention.

One of average skill in the art will also recognize that the functional building blocks, and other illustrative blocks, modules and components herein, can be implemented as illustrated or by discrete components, application specific integrated circuits, processors executing appropriate software and the like or any combination thereof.

Moreover, although described in detail for purposes of clarity and understanding by way of the aforementioned embodiments, the present invention is not limited to such embodiments. It will be obvious to one of average skill in the art that various changes and modifications may be practiced within the spirit and scope of the invention, as limited only by the scope of the appended claims.

What is claimed is:

1. An apparatus, comprising:
at least one processor to:
scramble a plurality of header bits to generate a scrambled plurality of header bits;
pad a predetermined number of zero-valued bits to the scrambled plurality of header bits to generate a padded bit block;
employ a rate 3/4 low density parity check (LDPC) code to encode the padded bit block to generate a plurality of LDPC parity bits;
generate a first sequence based on the scrambled plurality of header bits and a first subset of the plurality of LDPC parity bits;
generate a second sequence by XOR processing a third sequence, being a concatenation of the scrambled plurality of header bits followed by a second subset of the plurality of LDPC parity bits, with a first pad sequence;
generate a fourth sequence by XOR processing a fifth sequence, being a concatenation of the scrambled plurality of header bits followed by a third subset of the plurality of LDPC parity bits, with a second pad sequence;
concatenate the first sequence followed by the second sequence followed by the third sequence to form a sixth sequence;
map the sixth sequence as quadrature phase shift keying (QPSK) and insert a plurality of pilot symbols to generate a seventh sequence; and
modulate the seventh sequence as an orthogonal frequency division multiplexing (OFDM) symbol; and
a transmit driver to transmit a physical layer (PHY) frame, that includes the OFDM symbol and data, to at least one additional apparatus in accordance with OFDM signaling.

2. The apparatus of claim 1, wherein:
the first subset of the plurality of LDPC parity bits including a first contiguous subset of the plurality of LDPC parity bits that includes a most significant bit (MSB) of the plurality of LDPC parity bits;
the second subset of the plurality of LDPC parity bit including a second contiguous subset of the plurality of LDPC parity bits concatenated with a third contiguous subset of the plurality of LDPC parity bits; and
the third subset of the plurality of LDPC parity bits including a fourth contiguous subset of the plurality of LDPC parity bits that includes a least significant bit (LSB) of the plurality of LDPC parity bits.

3. The apparatus of claim 1, wherein:
the XOR processing of the third sequence with the first pad sequence beginning with a least significant bit (LSB) of the third sequence and employing each successive bit of the third sequence to generate the second sequence; and
the XOR processing of the fifth sequence with the second pad sequence beginning with a LSB of the fifth sequence and employing each successive bit of the fifth sequence to generate the fourth sequence.

4. The apparatus of claim 1, wherein:
the OFDM symbol indicates a plurality of information corresponding to the PHY frame or data including frame length, a code type by which the data are encoded, a code rate by which the data are encoded, and at least one modulation by which symbols of the data are modulated.

5. The apparatus of claim 1, wherein:
the apparatus being a communication device operative within at least one of a satellite communication system, a wireless communication system, a wired communication system, and a fiber-optic communication system.

6. An apparatus, comprising:
at least one processor to:
scramble a plurality of header bits to generate a scrambled plurality of header bits;
pad a plurality of pad bits to the scrambled plurality of header bits to generate a padded bit block;
employ an low density parity check (LDPC) code to encode the padded bit block to generate a plurality of LDPC parity bits;
generate a first sequence based on the scrambled plurality of header bits and a first subset of the plurality of LDPC parity bits;
generate a second sequence by XOR processing a third sequence, based on the scrambled plurality of header bits and a second subset of the plurality of LDPC parity bits, with a first pad sequence;
generate a fourth sequence by XOR processing a fifth sequence, based on the scrambled plurality of header bits and a third subset of the plurality of LDPC parity bits, with a second pad sequence;
concatenate the first sequence, the second sequence, and the third sequence to form a sixth sequence;
map the sixth sequence as quadrature phase shift keying (QPSK) and insert a plurality of pilot symbols to generate a seventh sequence; and
modulate the seventh sequence as an orthogonal frequency division multiplexing (OFDM) symbol; and
a transmit driver to transmit the OFDM symbol or a signal corresponding to the OFDM symbol to at least one additional apparatus.

7. The apparatus of claim 6, wherein:
the first subset of the plurality of LDPC parity bits including a first contiguous subset of the plurality of LDPC parity bits that includes a most significant bit (MSB) of the plurality of LDPC parity bits;
the second subset of the plurality of LDPC parity bit including a second contiguous subset of the plurality of LDPC parity bits concatenated with a third contiguous subset of the plurality of LDPC parity bits; and
the third subset of the plurality of LDPC parity bits including a fourth contiguous subset of the plurality of LDPC parity bits that includes a least significant bit (LSB) of the plurality of LDPC parity bits.

8. The apparatus of claim 6, wherein:
the plurality of header bits includes a predetermined number of header bits;
the plurality of pad bits includes a predetermined number of zero-valued bits;
the LDPC code being a rate 3/4 LDPC code;
the third sequence being a concatenation of the scrambled plurality of header bits followed by the second subset of the plurality of LDPC parity bits;
the fifth sequence being a concatenation of the scrambled plurality of header bits followed by the third of the plurality of LDPC parity bits; and
the sixth sequence being a concatenation of the first sequence followed by the second sequence followed by the third sequence.

9. The apparatus of claim 6, wherein:
the XOR processing of the third sequence with the first pad sequence beginning with a least significant bit (LSB) of the third sequence and employing each successive bit of the third sequence to generate the second sequence; and
the XOR processing of the fifth sequence with the second pad sequence beginning with a LSB of the fifth sequence and employing each successive bit of the fifth sequence to generate the fourth sequence.

10. The apparatus of claim 6, wherein the at least one processor including:
a scrambler circuitry to scramble the plurality of header bits to generate the scrambled plurality of header bits;
a padding circuitry to pad the plurality of pad bits to the scrambled plurality of header bits to generate the padded bit block;
an LDPC encoder circuitry to employ the LDPC code to encode the padded bit block to generate the plurality of LDPC parity bits;
a shorten/puncture circuitry to:
generate the first sequence based on the scrambled plurality of header bits and the first subset of the plurality of LDPC parity bits;
generate the second sequence by XOR processing the third sequence, based on the scrambled plurality of header bits and the second subset of the plurality of LDPC parity bits, with the first pad sequence;
generate the fourth sequence by XOR processing the fifth sequence, based on the scrambled plurality of header bits and the third subset of the plurality of LDPC parity bits, with the second pad sequence;
concatenate the first sequence, the second sequence, and the third sequence to form the sixth sequence; and
a symbol mapper to:
map the sixth sequence as QPSK and insert the plurality of pilot symbols to generate the seventh sequence; and
modulate the seventh sequence as the OFDM symbol.

11. The apparatus of claim 6, wherein:
the transmit driver to transmit a physical layer (PHY) frame, that includes the OFDM symbol and data, to at least one additional apparatus in accordance with OFDM signaling.

12. The apparatus of claim 6, wherein:
the transmit driver to transmit a physical layer (PHY) frame, that includes the OFDM symbol and data, to at least one additional apparatus in accordance with OFDM signaling; and
the OFDM symbol indicates a plurality of information corresponding to the PHY frame or data including frame length, a code type by which the data are encoded, a code rate by which the data are encoded, and at least one modulation by which symbols of the data are modulated.

13. The apparatus of claim 6, wherein:
the apparatus being a communication device operative within at least one of a satellite communication system, a wireless communication system, a wired communication system, and a fiber-optic communication system.

14. A method for operating a communication device, the method comprising:
scrambling a plurality of header bits to generate a scrambled plurality of header bits;
padding a plurality of pad bits to the scrambled plurality of header bits to generate a padded bit block;
employing an low density parity check (LDPC) code to encode the padded bit block to generate a plurality of LDPC parity bits;
generating a first sequence based on the scrambled plurality of header bits and a first subset of the plurality of LDPC parity bits;
generating a second sequence by XOR processing a third sequence, based on the scrambled plurality of header bits and a second subset of the plurality of LDPC parity bits, with a first pad sequence;
generating a fourth sequence by XOR processing a fifth sequence, based on the scrambled plurality of header bits and a third subset of the plurality of LDPC parity bits, with a second pad sequence;
concatenating the first sequence, the second sequence, and the third sequence to form a sixth sequence;
mapping the sixth sequence as quadrature phase shift keying (QPSK) and insert a plurality of pilot symbols to generate a seventh sequence; and
modulating the seventh sequence as an orthogonal frequency division multiplexing (OFDM) symbol; and
via an output of the communication device, transmitting the OFDM symbol or a signal corresponding to the OFDM symbol to at least one additional communication device.

15. The method of claim 14, wherein:
the first subset of the plurality of LDPC parity bits including a first contiguous subset of the plurality of LDPC parity bits that includes a most significant bit (MSB) of the plurality of LDPC parity bits;
the second subset of the plurality of LDPC parity bit including a second contiguous subset of the plurality of LDPC parity bits concatenated with a third contiguous subset of the plurality of LDPC parity bits; and
the third subset of the plurality of LDPC parity bits including a fourth contiguous subset of the plurality of LDPC parity bits that includes a least significant bit (LSB) of the plurality of LDPC parity bits.

16. The method of claim 14, wherein:
the plurality of header bits includes a predetermined number of header bits;
the plurality of pad bits includes a predetermined number of zero-valued bits;
the LDPC code being a rate 3/4 LDPC code;
the third sequence being a concatenation of the scrambled plurality of header bits followed by the second subset of the plurality of LDPC parity bits;
the fifth sequence being a concatenation of the scrambled plurality of header bits followed by the third of the plurality of LDPC parity bits; and
the sixth sequence being a concatenation of the first sequence followed by the second sequence followed by the third sequence.

17. The method of claim 14, wherein:
the XOR processing of the third sequence with the first pad sequence beginning with a least significant bit (LSB) of the third sequence and employing each successive bit of the third sequence to generate the second sequence; and
the XOR processing of the fifth sequence with the second pad sequence beginning with a LSB of the fifth sequence and employing each successive bit of the fifth sequence to generate the fourth sequence.

18. The method of claim 14, further comprising:
via the output of the communication device, transmitting a physical layer (PHY) frame, that includes the OFDM symbol and data, to at least one additional communication device in accordance with OFDM signaling.

19. The method of claim 14, further comprising:
via the output of the communication device, transmitting a physical layer (PHY) frame, that includes the OFDM symbol and data, to at least one additional apparatus in accordance with OFDM signaling; and wherein:
the OFDM symbol indicates a plurality of information corresponding to the PHY frame or data including frame length, a code type by which the data are encoded, a code rate by which the data are encoded, and at least one modulation by which symbols of the data are modulated.

20. The method of claim 14, wherein:
the communication device operative within at least one of a satellite communication system, a wireless communication system, a wired communication system, and a fiber-optic communication system.

* * * * *